(12) United States Patent
Tago et al.

(10) Patent No.: US 12,720,893 B2
(45) Date of Patent: Aug. 25, 2026

(54) DETECTION DEVICE WITH COUPLING PORTION FOR PHOTODIODES

(71) Applicant: Magnolia White Corporation, Tokyo (JP)

(72) Inventors: Keiji Tago, Tokyo (JP); Tetsuya Yamamoto, Tokyo (JP); Kenichi Akiyama, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 584 days.

(21) Appl. No.: 18/101,693

(22) Filed: Jan. 26, 2023

(65) Prior Publication Data

US 2023/0178574 A1 Jun. 8, 2023

Related U.S. Application Data

(63) Continuation of application No. PCT/JP2021/023404, filed on Jun. 21, 2021.

(30) Foreign Application Priority Data

Jul. 27, 2020 (JP) ................................ 2020-126767

(51) Int. Cl.
*H10F 39/00* (2025.01)
*H10F 39/18* (2025.01)
(Continued)

(52) U.S. Cl.
CPC ......... *H10F 39/8063* (2025.01); *H10F 39/18* (2025.01); *H10F 39/804* (2025.01); *G06V 10/147* (2022.01); *G06V 40/1324* (2022.01)

(58) Field of Classification Search
CPC ..... H10F 39/12; H10F 39/8053; H10F 39/806
See application file for complete search history.

(56) References Cited

U.S. PATENT DOCUMENTS 5,514,888 A * 5/1996 Sano .................. H10F 39/8057 438/69
6,618,087 B1 9/2003 Hokari et al.
(Continued)

FOREIGN PATENT DOCUMENTS

CN 110473887 A 11/2019
CN 111129056 A * 5/2020 .......... H10F 39/024
(Continued)

OTHER PUBLICATIONS

International Search Report of corresponding PCT application PCT/JP2021/023404, dated Sep. 21, 2021.
(Continued)

*Primary Examiner* — William B Partridge
*Assistant Examiner* — Felix B Andrews
(74) *Attorney, Agent, or Firm* — K&L Gates LLP

(57) ABSTRACT

According to an aspect, a detection device includes: a detection element formed on a substrate; a photodiode provided in the detection element; partial photodiodes included in the photodiode; an organic protective film covering the partial photodiodes; lenses provided so as to overlap the partial photodiodes; a first light-blocking layer between the organic protective films and the lenses and provided with first openings in regions overlapping the partial photodiodes; a second light-blocking layer between the first light-blocking layer and the lenses and provided with second openings in regions overlapping the partial photodiodes and the first openings; a first light-transmitting resin layer provided between the first light-blocking layer and the second light-blocking layer; and a second light-transmitting resin layer provided between the second light-blocking layer and the lenses. The first light-blocking layer is provided on the organic protective film so as to be directly in contact with the organic protective film.

14 Claims, 15 Drawing Sheets

(51) Int. Cl.
*G06V 10/147* (2022.01)
*G06V 40/13* (2022.01)

(56) References Cited

U.S. PATENT DOCUMENTS

2002/0074487 A1* 6/2002 Ito ...................... G01D 5/34746 250/231.13
2008/0122933 A1 5/2008 Murayama
2013/0037902 A1* 2/2013 Nakazawa .......... H10F 39/8057 257/E31.127
2015/0301400 A1* 10/2015 Kimura .................. H04N 13/00 349/110
2016/0380222 A1* 12/2016 Satoh ................. H10K 59/8731 257/40
2020/0035729 A1 1/2020 Lee et al.
2020/0089928 A1 3/2020 Long et al.
2022/0128397 A1* 4/2022 Watanabe ................ G01V 8/20
2022/0216259 A1* 7/2022 Wakabayashi ...... H10F 39/8057

FOREIGN PATENT DOCUMENTS

JP 10645569 A 2/1994
JP H09171154 A 6/1997
JP H11177075 A 7/1999
JP 2005-019958 A 1/2005
JP 2007235509 A * 9/2007
JP 2008008700 A 1/2008
JP 2010093124 A 4/2010
JP 2013038266 A 2/2013
JP 2018-139394 A 9/2018
JP 2020017955 A 1/2020
WO WO-2014148291 A1 * 9/2014 ............. H04N 23/45

OTHER PUBLICATIONS

Office Action issued in related Japanese Patent Application No. 2020-126767 on Oct. 8, 2024 and English translation of same. 13 pages.

Office Action issued in related Japanese Patent Application No. 2020-126767 on Jun. 4, 2024 and English translation of same. 11 pages.

* cited by examiner 3
7
29
28
27
26
SLcom
25
24
23
22
21
36
34
H1
H2
H3
61d 61e
H11
H13
H14
33
31
32
30
(30S-1)
35
37
GLsf
61c
63
64
(GLrst)
61
(61a)
Mrst
62
(SLrst)
61b
H5
2

DETECTION DEVICE WITH COUPLING PORTION FOR PHOTODIODES

CROSS-REFERENCES

This application claims the benefit of priority from Japanese Patent Application No. 2020-126767 filed on Jul. 27, 2020 and International Patent Application No. PCT/JP2021/023404 filed on Jun. 21, 2021, the entire contents of which are incorporated herein by reference.

BACKGROUND

1. Technical Field

What is disclosed herein relates to a detection device.

2. Description of the Related Art

Japanese Patent Application Laid-open Publication No. H09-171154 (JP-A-H09-171154) describes an image input optical system that includes a lens array having a plurality of arranged lenses, an optical sensor array having a plurality of arranged optical sensors, and a pinhole array provided between the lens array and the optical sensor array. United States Patent Application Publication No. 2020/0089928 describes an optical imaging device having a light-blocking layer provided with an opening between a microlens and an optical sensor.

In detection devices using such technologies, what is called crosstalk may occur in which light in an oblique direction enters other optical sensors. This phenomenon may cause the detection accuracy to degrade, for example, may cause blurring of images. In the image input optical system of JP-A-H09-171154, the positional relation between the lenses, the optical sensors, and the pinhole array is greatly restricted. Therefore, the crosstalk may be difficult to be reduced when trying to achieve high-definition detection by reducing the arrangement pitch of the photodiodes.

For the foregoing reasons, there is a need for a detection device capable of improving the detection accuracy.

SUMMARY

According to an aspect, a detection device includes: a detection element formed on a substrate; a photodiode provided in the detection element; a plurality of partial photodiodes included in the photodiode; an organic protective film covering the partial photodiodes; a plurality of lenses provided so as to overlap the respective partial photodiodes; a first light-blocking layer provided between a plurality of the organic protective films and the lenses and provided with first openings in regions overlapping the respective partial photodiodes; a second light-blocking layer provided between the first light-blocking layer and the lenses and provided with second openings in regions overlapping the respective partial photodiodes and the respective first openings; a first light-transmitting resin layer provided between the first light-blocking layer and the second light-blocking layer; and a second light-transmitting resin layer provided between the second light-blocking layer and the lenses. The first light-blocking layer is provided on the organic protective film so as to be directly in contact with the organic protective film.

According to an aspect, a detection device includes: a glass substrate; a first detection element comprising a first photodiode and a second detection element comprising a second photodiode that are formed on the glass substrate; and a light-blocking layer overlapping the first photodiode and the second photodiode and having a plurality of openings. The number of the openings that overlap the first detection element differs from the number of the openings that overlap the second detection element.

DETAILED DESCRIPTION

Figure 1A:
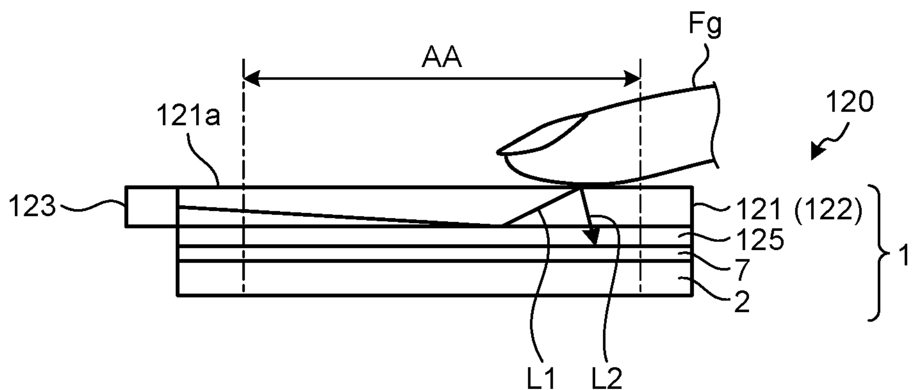
FIG. 1A is a sectional view illustrating a schematic sectional configuration of a detection apparatus having an illumination device, the detection apparatus including a detection device according to an embodiment.

The following describes a mode (embodiment) for carrying out the present disclosure in detail with reference to the drawings. The present disclosure is not limited to the description of the embodiment given below. Components described below include those easily conceivable by those skilled in the art or those substantially identical thereto. In addition, the components described below can be combined as appropriate. What is disclosed herein is merely an example, and the present disclosure naturally encompasses appropriate modifications easily conceivable by those skilled in the art while maintaining the gist of the present disclosure. To further clarify the description, the drawings may schematically illustrate, for example, widths, thicknesses, and shapes of various parts as compared with actual aspects thereof. However, they are merely examples, and interpretation of the present disclosure is not limited thereto.

The same component as that described with reference to an already mentioned drawing is denoted by the same reference numeral through the present disclosure and the drawings, and detailed description thereof may not be repeated where appropriate.

In the present specification and claims, in expressing an aspect of disposing another structure on or above a certain structure, a case of simply expressing "on" includes both a case of disposing the other structure immediately on the certain structure so as to contact the certain structure and a case of disposing the other structure above the certain structure with still another structure interposed therebetween, unless otherwise specified.

Figure 1B:
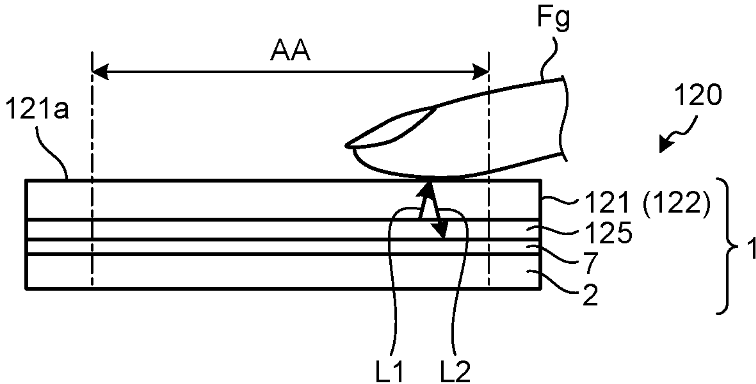
FIG. 1B is a sectional view illustrating a schematic sectional configuration of the detection apparatus having an illumination device, the detection apparatus including the detection device according to a first modification.
Figure 1C:
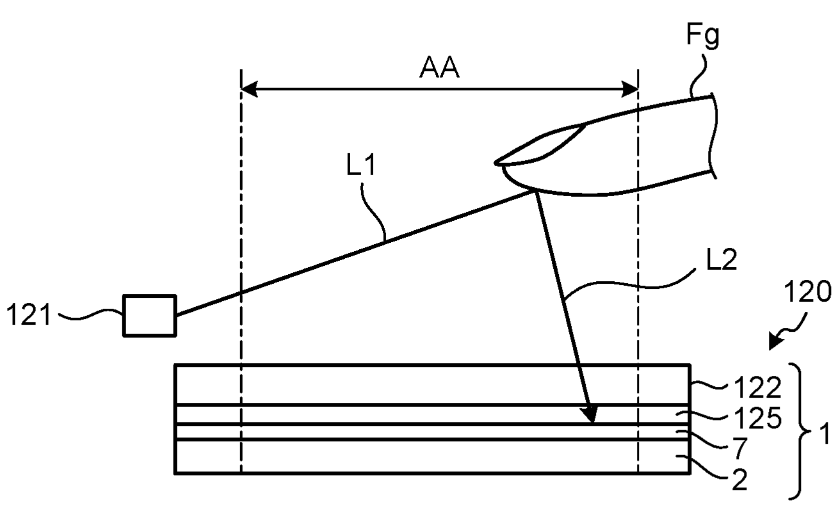
FIG. 1C is a sectional view illustrating a schematic sectional configuration of the detection apparatus having an illumination device, the detection apparatus including the detection device according to a second modification.
Figure 1D:
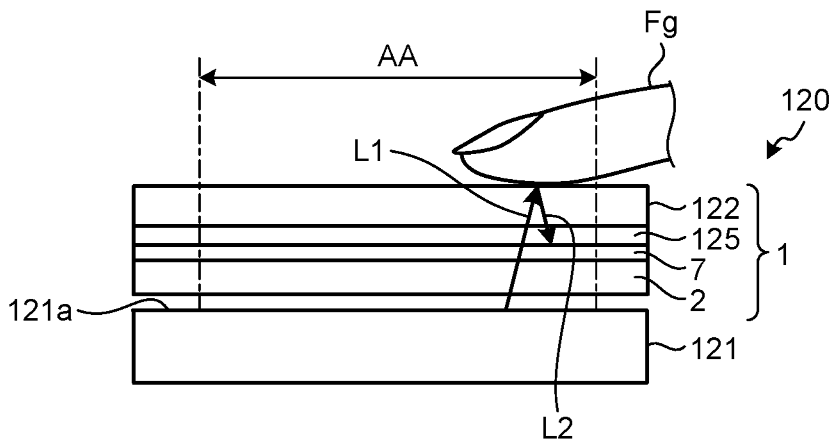
FIG. 1D is a sectional view illustrating a schematic sectional configuration of the detection apparatus having an illumination device, the detection apparatus including the detection device according to a third modification.

FIG. 1A is a sectional view illustrating a schematic sectional configuration of a detection apparatus having an illumination device, the detection apparatus including a detection device according to an embodiment. FIG. 1B is a sectional view illustrating a schematic sectional configuration of the detection apparatus having an illumination device, the detection apparatus including the detection device according to a first modification. FIG. 1C is a sectional view illustrating a schematic sectional configuration of the detection apparatus having an illumination device, the detection apparatus including the detection device according to a second modification. FIG. 1D is a sectional view illustrating a schematic sectional configuration of the detection apparatus having an illumination device, the detection apparatus including the detection device according to a third modification.

As illustrated in FIG. 1A, a detection apparatus 120 having an illumination device includes a detection device 1 and an illumination device 121. The detection device 1 includes an array substrate 2, an optical filter 7, an adhesive layer 125, and a cover member 122. In other words, the array substrate 2, the optical filter 7, the adhesive layer 125, and the cover member 122 are stacked in the order as listed, in a direction orthogonal to a surface of the array substrate 2. As will be describe later, the cover member 122 of the detection device 1 may be replaced with the illumination device 121. The adhesive layer 125 only needs to bond the optical filter 7 to the cover member 122. Hence, the detection device 1 may have a structure without the adhesive layer 125 in a region corresponding to a detection region AA. When the adhesive layer 125 is not provided in the detection region AA, the detection device 1 has a structure in which the adhesive layer 125 bonds the cover member 122 to the optical filter 7 in a region corresponding to a peripheral region GA outside the detection region AA. In that case, the adhesive layer 125 provided in the detection region AA may be simply paraphrased as a "protective layer 125" for the optical filter 7.

As illustrated in FIG. 1A, the illumination device 121 may be, for example, what is called a side light-type front light that uses the cover member 122 as a light guide plate provided in a position corresponding to the detection region AA of the detection device 1 and includes a plurality of light sources 123 arranged at one end or both ends of the cover member 122. That is, the cover member 122 has a light-emitting surface 121*a* for emitting light, and serves as one component of the illumination device 121. The illumination device 121 emits light L1 from the light-emitting surface 121*a* of the cover member 122 toward a finger Fg that serves as a detection target. For example, light-emitting diodes (LEDs) for emitting light in a predetermined color are used as the light sources.

As illustrated in FIG. 1B, the illumination device 121 may include the light sources (for example, LEDs) provided directly below the detection region AA of the detection device 1. The illumination device 121 including the light sources also serves as the cover member 122.

The illumination device 121 is not limited to the example of FIG. 1B. As illustrated in FIG. 1C, the illumination device 121 may be provided above a lateral side or an upper side of the cover member 122, and may emit the light L1 to the finger Fg from the lateral side or the upper side of the finger Fg.

Furthermore, as illustrated in FIG. 1D, the illumination device 121 may be what is called a direct-type backlight that includes the light sources (for example, LEDs) provided in the detection region of the detection device 1.

The light L1 emitted from the illumination device 121 is reflected as light L2 by the finger Fg serving as the detection target. The detection device 1 detects the light L2 reflected by the finger Fg to detect asperities (such as a fingerprint) on a surface of the finger Fg. The detection device 1 may further detect information on a living body by detecting the light L2 reflected in the finger Fg, in addition to detecting the fingerprint. Examples of the information on the living body include a blood vessel image, pulsation, and a pulse wave of, for example, a vein. The color of the light L1 from the illumination device 121 may be varied depending on the detection target.

The cover member 122 is a member for protecting the array substrate 2 and the optical filter 7, and covers the array substrate 2 and the optical filter 7. The illumination device 121 may have a structure to double as the cover member 122, as described above. In the structures illustrated in FIGS. 1C and 1D in which the cover member 122 is separate from the illumination device 121, the cover member 122 is, for example, a glass substrate. The cover member 122 is not limited to the glass substrate, and may be a resin substrate, for example. The cover member 122 may be omitted. In that case, the surface of the array substrate 2 and the optical filter 7 is provided with a protective layer of, for example, an insulating film, and the finger Fg contacts the protective layer of the detection device 1.

The detection apparatus 120 having an illumination device may be provided with a display panel instead of the illumination device 121, as illustrated in FIG. 1B. The display panel may be, for example, an organic electroluminescent (EL) (organic light-emitting diode (OLED)) display panel or an inorganic EL (micro-LED or mini-LED) display panel. Alternatively, the display panel may be a liquid crystal display (LCD) panel using liquid crystal elements as display elements or an electrophoretic display (EPD) panel using electrophoretic elements as the display elements. Even in this case, the fingerprint of the finger Fg and the information on the living body can be detected based on the light L2 obtained by reflecting, by the finger Fg, display light (light L1) emitted from the display panel.

Figure 2:
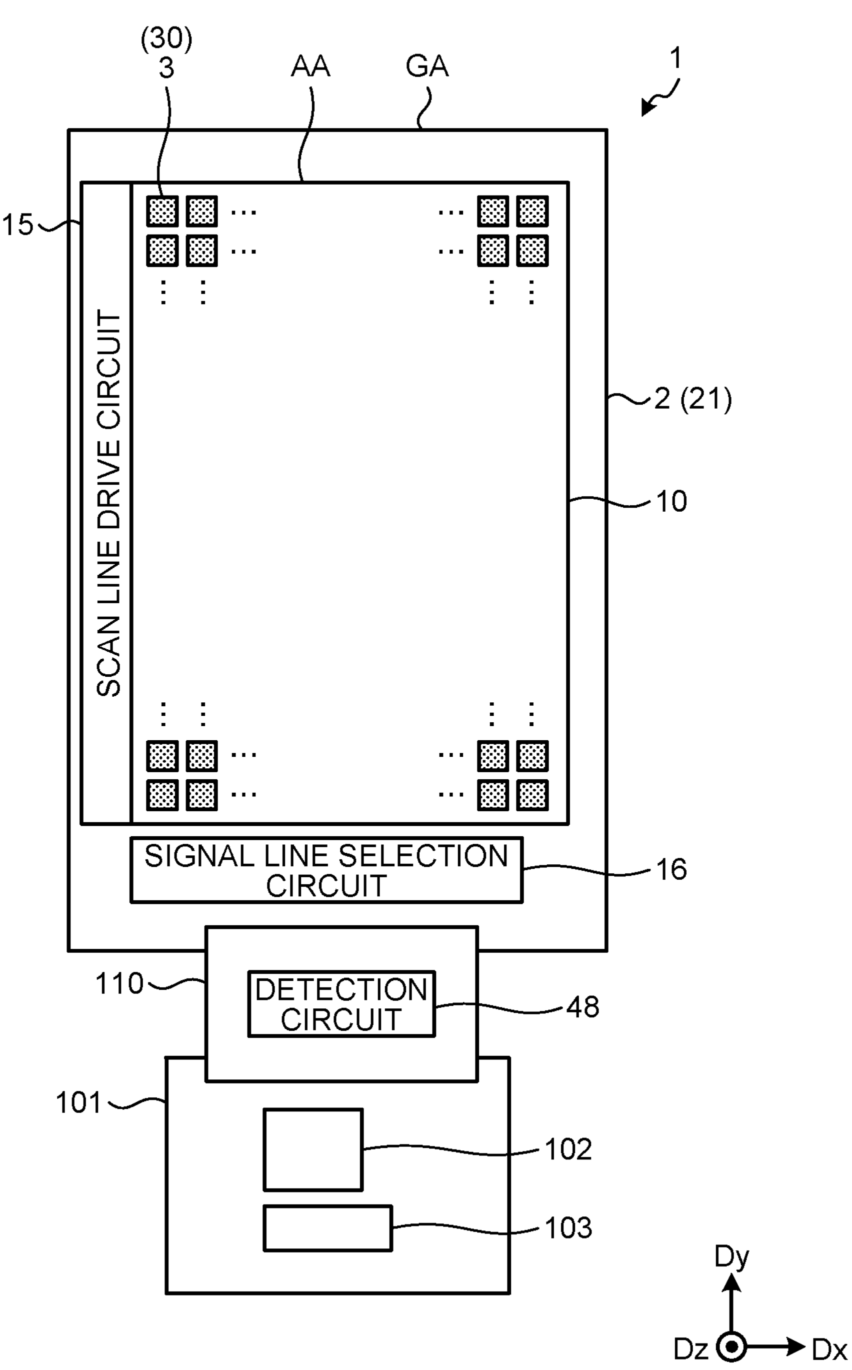
FIG. 2 is a plan view illustrating the detection device according to the embodiment.

FIG. 2 is a plan view illustrating the detection device according to the embodiment. A first direction Dx illustrated in FIG. 2 and the subsequent drawings is one direction in a plane parallel to a substrate 21. A second direction Dy is one direction in the plane parallel to the substrate 21, and is a direction orthogonal to the first direction Dx. The second direction Dy may non-orthogonally intersect the first direction Dx. A third direction Dz is a direction orthogonal to the first direction Dx and the second direction Dy, and is a direction normal to the substrate 21.

As illustrated in FIG. 2, the detection device 1 includes the array substrate 2 (substrate 21), a sensor 10, a scan line drive circuit 15, a signal line selection circuit 16, a detection circuit 48, a control circuit 102, and a power supply circuit 103.

The substrate 21 is electrically coupled to a control substrate 101 through a wiring substrate 110. The wiring substrate 110 is, for example, a flexible printed circuit board or a rigid circuit board. The wiring substrate 110 is provided with the detection circuit 48. The control substrate 101 is provided with the control circuit 102 and the power supply circuit 103. The control circuit 102 is, for example, a field-programmable gate array (FPGA). The control circuit 102 supplies control signals to the sensor 10, the scan line drive circuit 15, and the signal line selection circuit 16 to control an operation of the sensor 10. The power supply circuit 103 supplies voltage signals including, for example, a power supply potential VDD and a reference potential VCOM (refer to FIG. 4) to the sensor 10, the scan line drive circuit 15, and the signal line selection circuit 16. In the present embodiment, the case is exemplified where the detection circuit 48 is disposed on the wiring substrate 110, but the present disclosure is not limited to this case. The detection circuit 48 may be disposed on the substrate 21.

The substrate 21 has the detection region AA and a peripheral region GA. The detection region AA and the peripheral region GA extend in planar directions parallel to the substrate 21. Elements (detection elements 3) of the sensor 10 are provided in the detection region AA. The peripheral region GA is a region outside the detection region AA, and is a region not provided with the elements (detection elements 3). That is, the peripheral region GA is a region between the outer periphery of the detection region AA and the outer edges of the substrate 21. The scan line drive circuit 15 and the signal line selection circuit 16 are provided in the peripheral region GA. The scan line drive circuit 15 is provided in a region extending along the second direction Dy in the peripheral region GA. The signal line selection circuit 16 is provided in an area extending along the first direction Dx in the peripheral area GA, and is provided between the sensor 10 and the detection circuit 48.

Each of the detection elements 3 of the sensor 10 is an optical sensor including a photodiode 30 as a sensor element. The photodiode 30 is a photoelectric conversion element, and outputs an electrical signal corresponding to light irradiating each of the photodiodes 30. More specifically, the photodiode 30 is a positive-intrinsic-negative (PIN) photodiode. The photodiode 30 may be paraphrased as an organic photodiode (OPD). The detection elements 3 are arranged in a matrix having a row-column configuration in the detection region AA. The photodiode 30 included in each of the detection elements 3 performs the detection in accordance with gate drive signals (for example, a reset control signal RST and a read control signal RD) supplied from the scan line drive circuit 15. Each of the photodiodes 30 outputs the electrical signal corresponding to the light irradiating the photodiode 30 as a detection signal Vdet to the signal line selection circuit 16. The detection device 1 detects the information on the living body based on the detection signals Vdet received from the photodiodes 30.

Figure 3:
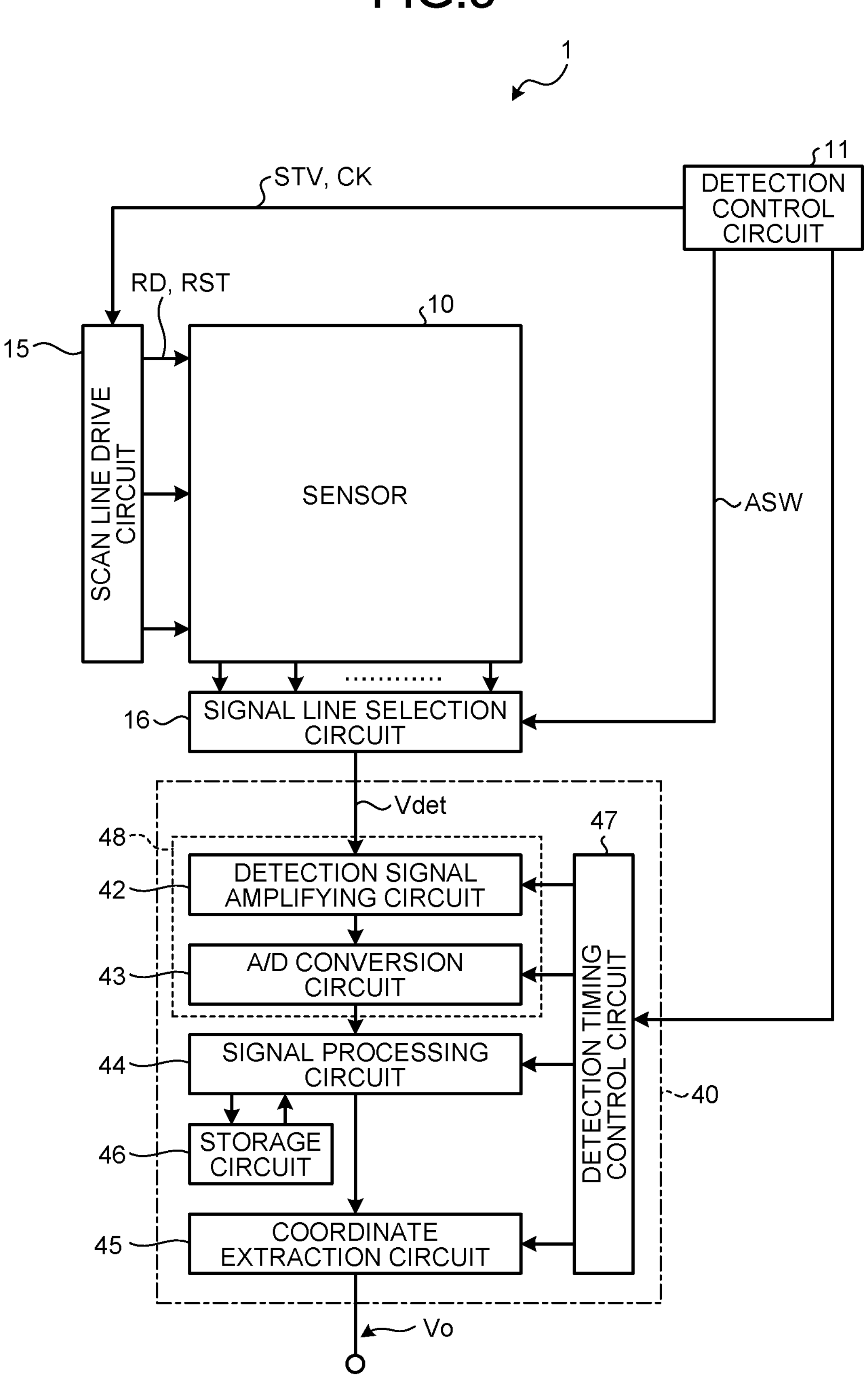
FIG. 3 is a block diagram illustrating a configuration example of the detection device according to the embodiment.

FIG. 3 is a block diagram illustrating a configuration example of the detection device according to the embodiment. As illustrated in FIG. 3, the detection device 1 further includes a detection control circuit 11 and a detector 40. The control circuit 102 includes one, some, or all functions of the detection control circuit 11. The control circuit 102 also includes one, some, or all functions of the detector 40 other than those of the detection circuit 48.

The detection control circuit 11 is a circuit that supplies respective control signals to the scan line drive circuit 15, the signal line selection circuit 16, and the detector 40 to control operations of these components. The detection control circuit 11 supplies various control signals including, for example, a start signal STV and a clock signal CK to the scan line drive circuit 15. The detection control circuit 11 also supplies various control signals including, for example, a selection signal ASW to the signal line selection circuit 16.

The scan line drive circuit 15 is a circuit that drives a plurality of scan lines (read control scan line GLrd and reset control scan lines GLrst (refer to FIG. 4)) based on the various control signals. The scan line drive circuit 15 sequentially or simultaneously selects the scan lines, and supplies the gate drive signals (for example, the reset control signals RST and the read control signals RD) to the selected scan lines. Through this operation, the scan line drive circuit 15 selects the photodiodes 30 coupled to the scan lines.

Figure 4:
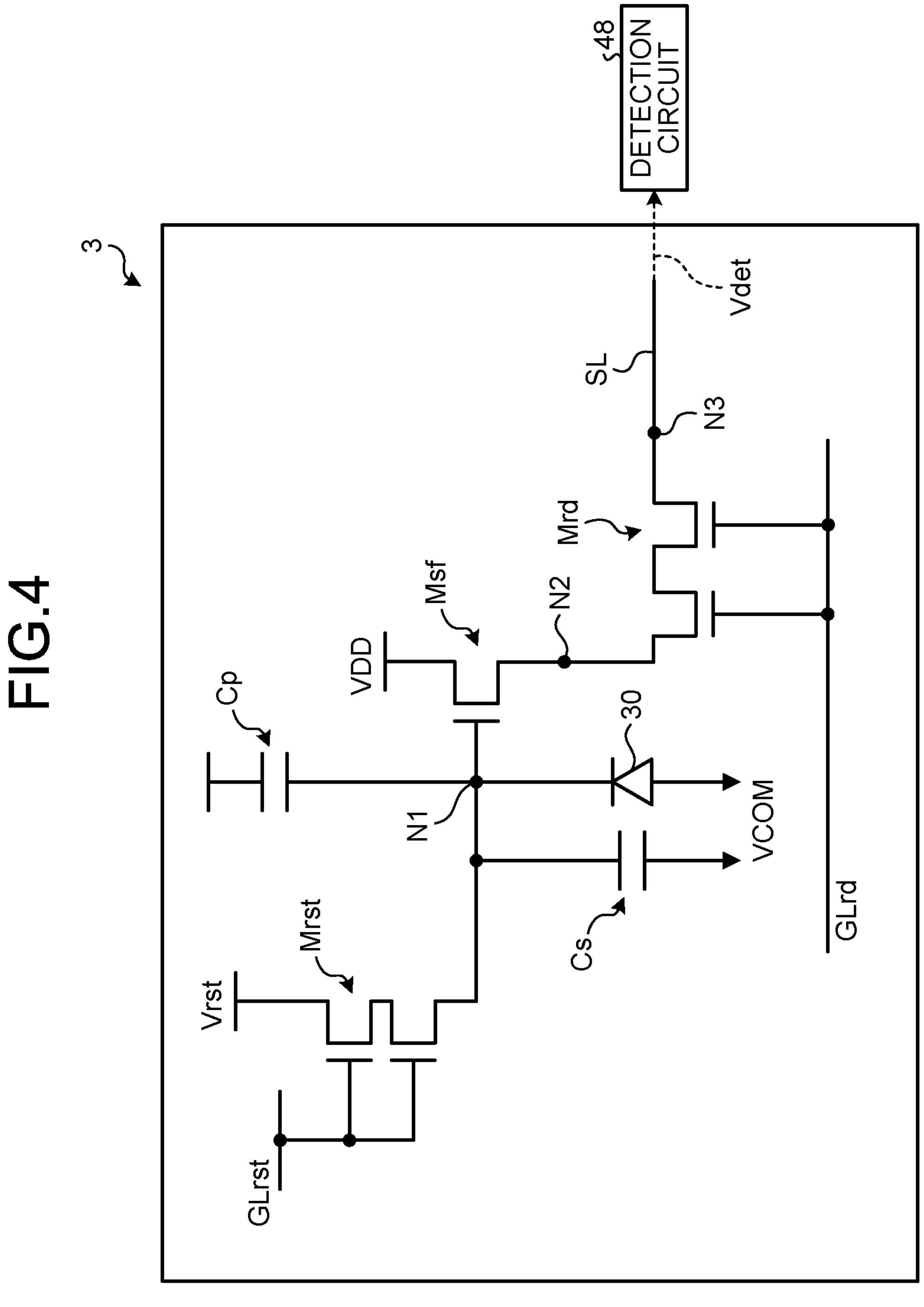
FIG. 4 is a circuit diagram illustrating a detection element.

The signal line selection circuit 16 is a switch circuit that sequentially or simultaneously selects a plurality of output signal lines SL (refer to FIG. 4). The signal line selection circuit 16 is, for example, a multiplexer. The signal line selection circuit 16 couples the selected output signal lines SL to the detection circuit 48 based on the selection signal ASW supplied from the detection control circuit 11. Through this operation, the signal line selection circuit 16 outputs the detection signals Vdet of the photodiodes 30 to the detector 40.

The detector 40 includes the detection circuit 48, a signal processing circuit 44, a coordinate extraction circuit 45, a storage circuit 46, and a detection timing control circuit 47. The detection timing control circuit 47 performs control to cause the detection circuit 48, the signal processing circuit 44, and the coordinate extraction circuit 45 to operate in synchronization with one another based on a control signal supplied from the detection control circuit 11.

The detection circuit 48 is, for example, an analog front-end (AFE) circuit. The detection circuit 48 is a signal processing circuit having functions of at least a detection signal amplifying circuit 42 and an analog-to-digital (A/D) conversion circuit 43. The detection signal amplifying circuit 42 amplifies the detection signal Vdet, and is an integration circuit, for example. The A/D conversion circuit 43 converts an analog signal output from the detection signal amplifying circuit 42 into a digital signal.

The signal processing circuit 44 is a logic circuit that detects a predetermined physical quantity received by the sensor 10 based on output signals of the detection circuit 48. The signal processing circuit 44 can detect asperities on the surface of the finger Fg or a palm based on the signals from the detection circuit 48 when the finger Fg is in contact with or in proximity to a detection surface. The signal processing circuit 44 may detect the information on the living body based on the signals from the detection circuit 48. Examples of the information on the living body include the blood vessel image, the pulse wave, the pulsation, and a blood oxygen saturation level of the finger Fg or the palm.

The storage circuit 46 temporarily stores therein signals calculated by the signal processing circuit 44. The storage circuit 46 may be, for example, a random-access memory (RAM) or a register circuit.

The coordinate extraction circuit 45 is a logic circuit that obtains detected coordinates of the asperities on the surface of the finger Fg or the like when the contact or proximity of the finger Fg is detected by the signal processing circuit 44. The coordinate extraction circuit 45 is the logic circuit that also obtains detected coordinates of blood vessels of the finger Fg or the palm. The coordinate extraction circuit 45 combines the detection signals Vdet output from the respective detection elements 3 of the sensor 10 to generate two-dimensional information representing a shape of the asperities on the surface of the finger Fg or the like. The coordinate extraction circuit 45 may output the detection signals Vdet as sensor outputs Vo instead of calculating the detected coordinates.

The following describes a circuit configuration example of the detection device 1. FIG. 4 is a circuit diagram illustrating the detection element. As illustrated in FIG. 4, the detection element 3 includes the photodiode 30, a reset transistor Mrst, a read transistor Mrd, and a source follower transistor Msf. The reset transistor Mrst, the read transistor Mrd, and the source follower transistor Msf are provided correspondingly to each of the photodiodes 30. The reset transistor Mrst, the read transistor Mrd, and the source follower transistor Msf are each made with an n-type thin-film transistor (TFT). However, each of the transistors is not limited thereto, and may be made with a p-type TFT.

The reference potential VCOM is applied to the anode of the photodiode 30. The cathode of the photodiode 30 is coupled to a node N1. The node N1 is coupled to a capacitive element Cs, one of the source and the drain of the reset transistor Mrst, and the gate of the source follower transistor Msf. The node N1 further has parasitic capacitance Cp. When light is incident on the photodiode 30, a signal (electric charge) output from the photodiode 30 is stored in the capacitive element Cs. The capacitive element Cs is, for example, capacitance generated between an upper conductive layer 34 and a lower conductive layer 35 that are coupled to the photodiode 30 (refer to FIG. 9). The parasitic capacitance Cp is capacitance added to the capacitive element Cs and is capacitance generated between various types of wiring and electrodes provided on the array substrate 2.

The gate of the reset transistor Mrst is coupled to the reset control scan line GLrst. The other of the source and the drain of the reset transistor Mrst is supplied with a reset potential Vrst. When the reset transistor Mrst is turned on (into a conduction state) in response to the reset control signal RST, the potential of the node N1 is reset to the reset potential Vrst. The reference potential VCOM is lower than the reset potential Vrst, and the photodiode 30 is driven in a reverse bias state.

The source follower transistor Msf is coupled between a terminal supplied with the power supply potential VDD and the read transistor Mrd (node N2). The gate of the source follower transistor Msf is coupled to the node N1. The gate of the source follower transistor Msf is supplied with a signal (electric charge) generated by the photodiode 30. This operation causes the source follower transistor Msf to output a voltage signal corresponding to the signal (electric charge) generated by the photodiode 30 to the read transistor Mrd.

The read transistor Mrd is coupled between the source of the source follower transistor Msf (node N2) and a corresponding one of the output signal lines SL (node N3). The gate of the read transistor Mrd is coupled to the read control scan line GLrd. When the read transistor Mrd is turned on in response to the read control signal RD, the signal output from the source follower transistor Msf, that is, the voltage signal corresponding to the signal (electric charge) generated by the photodiode 30 is output as the detection signal Vdet to the output signal line SL.

In the example illustrated in FIG. 4, the reset transistor Mrst and the read transistor Mrd each have what is called a double-gate structure configured by coupling two transistors in series. However, the structures of those transistors are not limited thereto, and the reset transistor Mrst and the read transistor Mrd may have a single-gate structure, or a multi-gate structure including three or more transistors coupled in series. The circuit of each of the detection elements 3 is not limited to the configuration including the three transistors of the reset transistor Mrst, the source follower transistor Msf, and the read transistor Mrd. The detection element 3 may include two transistors, or four or more transistors.

Figure 5:
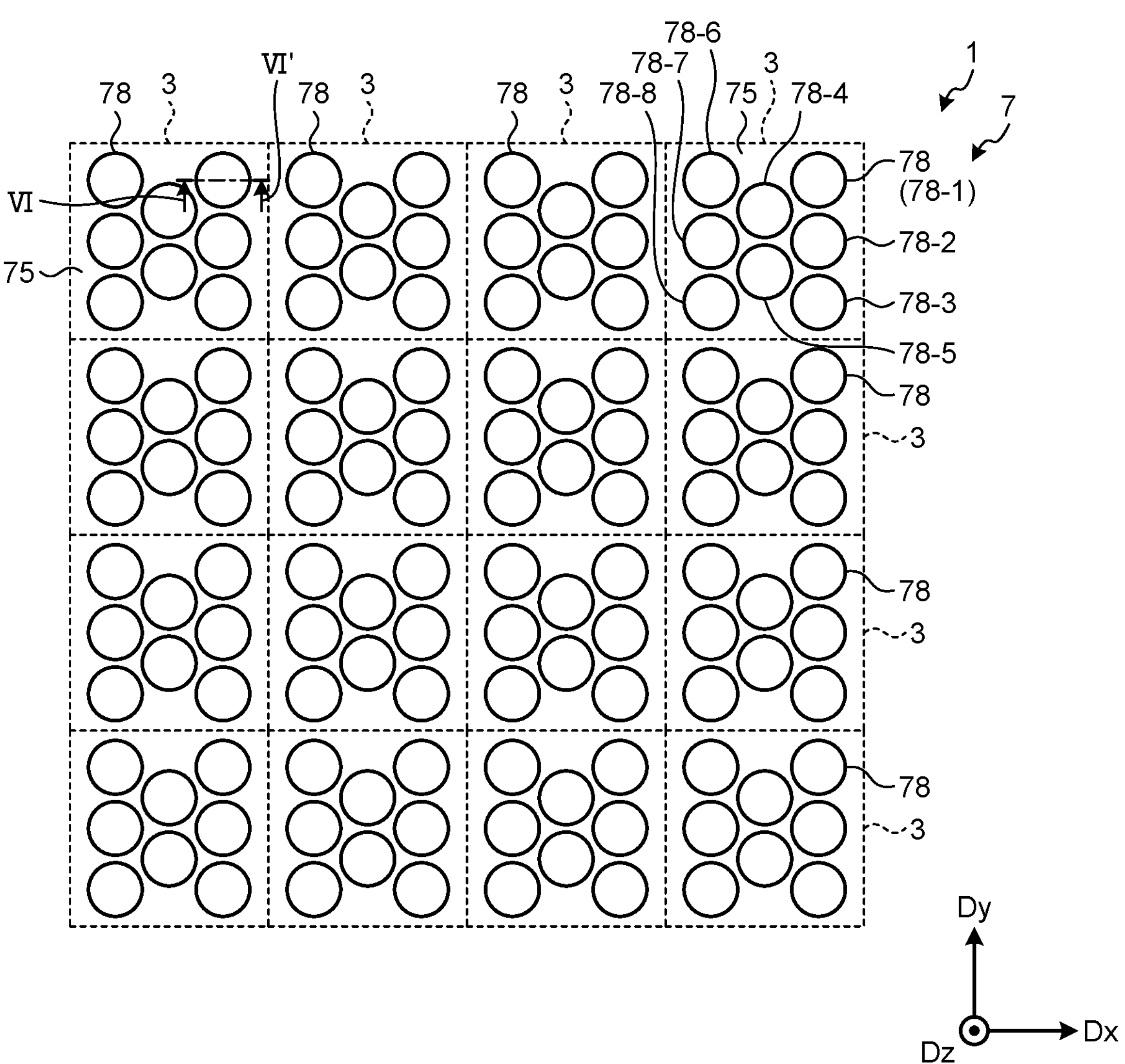
FIG. 5 is a plan view illustrating an optical filter according to the embodiment.

The following describes a detailed configuration of the detection elements 3 and the optical filter 7. FIG. 5 is a plan view illustrating the optical filter according to the embodiment. The optical filter 7 is an optical element that transmits first components and blocks second components, wherein the first components are components of the light L2 reflected by an object to be detected, such as the finger Fg, and travel in the third direction Dz toward the photodiodes 30, and the second components are components of the light L2 and travel in oblique directions. The optical filter 7 is also called collimating apertures or a collimator.

As illustrated in FIG. 5, the optical filter 7 is provided so as to cover the detection elements 3 (photodiodes 30) arranged in a matrix. The optical filter 7 includes a first light-transmitting resin layer 74 and a second light-transmitting resin layer 75 that cover the detection elements 3, and includes a plurality of lenses 78 provided for each of the detection elements 3. The lenses 78 are arranged for each of the detection elements 3. In the example illustrated in FIG. 5, eight lenses 78 of 78-1, 78-2, . . . , and 78-8 are provided for each of the detection elements 3. The lenses 78-1, 78-2, . . . , 78-8 are arranged in a triangular lattice pattern. As will be described later, each of the detection elements 3 has a plurality of detection regions (partial photodiodes 30S), thus having a structure in which the lenses 78 correspond to the detection regions in the detection element 3.

The number of the lenses 78 arranged in each of the detection elements 3 may, however, be seven or smaller, or nine of larger so as to match the number of the detection regions. The arrangement of the lenses 78 may also be changed as appropriate depending on the configuration of the photodiodes 30.

Figure 6:
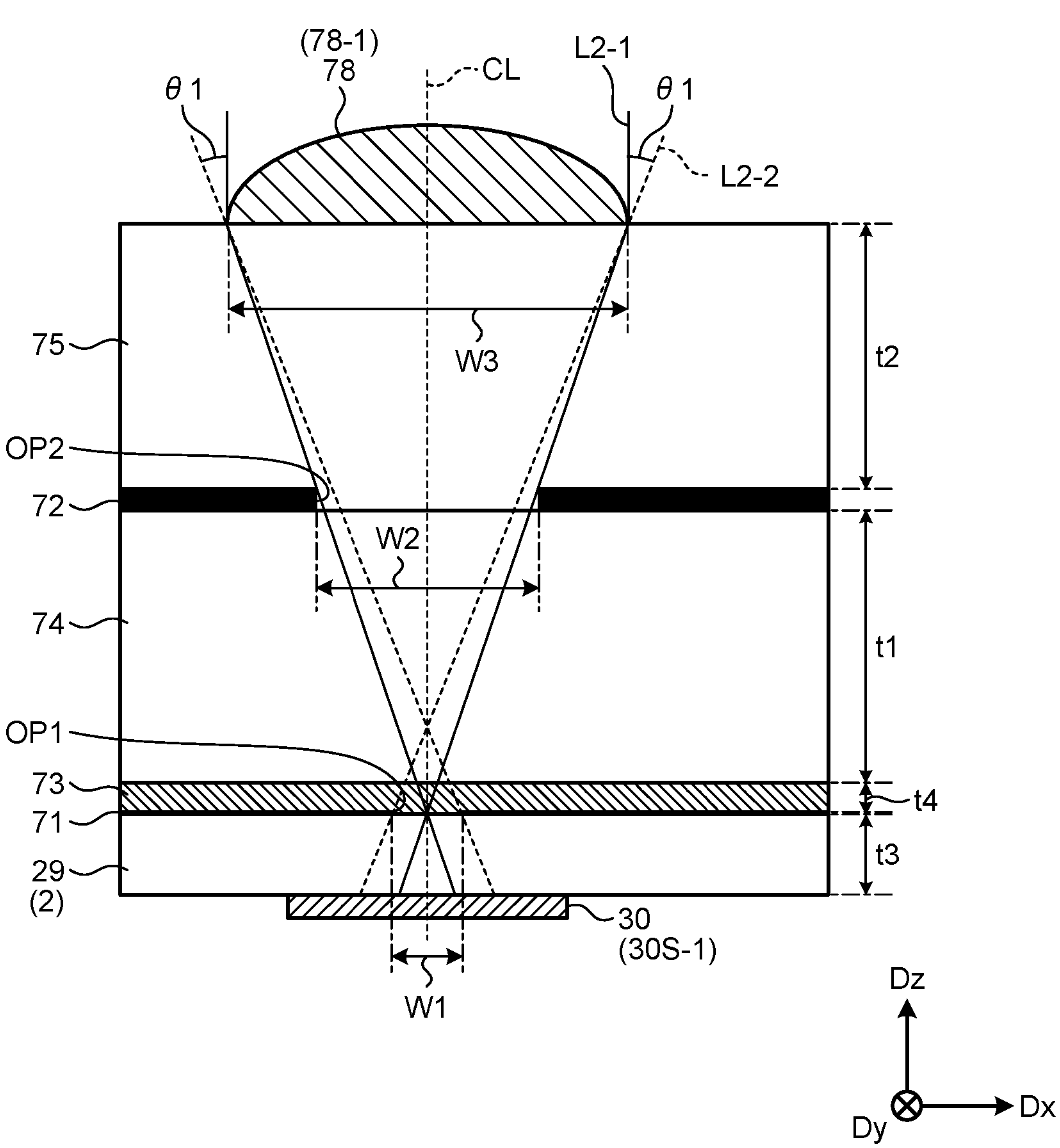
FIG. 6 is a sectional view illustrating the optical filter.

FIG. 6 is a sectional view illustrating the optical filter. FIG. 6 is a VI-VI' sectional view of FIG. 5. FIG. 6 illustrates the configuration of the array substrate 2 in a simplified manner and schematically illustrates the photodiode 30 (partial photodiode 30S-1) and a protective film 29 covering the photodiode 30.

As illustrated in FIG. 6, the optical filter 7 includes a first light-blocking layer 71, a second light-blocking layer 72, a filter layer 73, the first light-transmitting resin layer 74, the second light-transmitting resin layer 75, and the lens 78. In the present embodiment, the first light-blocking layer 71, the filter layer 73, the first light-transmitting resin layer 74, the second light-blocking layer 72, the second light-transmitting resin layer 75, and the lens 78 are stacked on the protective film 29 in the order as listed.

The lens 78 is provided in a region overlapping the partial photodiode 30S-1 of one of the photodiodes 30. The lens 78 is a convex lens. An optical axis CL of the lens 78 is provided in a direction parallel to the third direction Dz and intersects the partial photodiode 30S-1. The lens 78 is provided on the second light-transmitting resin layer 75 so as to be directly in contact therewith. In the present embodiment, no light-blocking layer or the like is provided on the second light-transmitting resin layer 75 between the adjacent lenses 78.

The first light-blocking layer 71 is provided on the protective film 29 of the array substrate 2 so as to be directly in contact therewith. In other words, the first light-blocking layer 71 is provided between the photodiode 30 and the lens 78 in the third direction Dz. The first light-blocking layer 71 is provided with a first opening OP1 in a region overlapping the photodiode 30. The first opening OP1 is formed in a region overlapping the optical axis CL.

The first light-blocking layer 71 is provided on the protective film 29 of the array substrate 2 so as to be directly in contact therewith. The first light-blocking layer 71 is formed of, for example, a metal material such as molybdenum (Mo). This configuration allows the first light-blocking layer 71 to reflect the components of the light L2 traveling in the oblique directions other than the light L2 passing through the first opening OP1. Since the first light-blocking layer 71 is formed of a metal material, the first opening OP1 can be accurately formed to have a width W1 (diameter) in the first direction Dx. Thus, the first opening OP1 can be provided correspondingly to the photodiode 30 even if the arrangement pitch and the area of the photodiodes 30 is small.

The first light-blocking layer 71 is formed by applying a process of forming the first opening OP1 in a metal material deposited by, for example, being sputtered on the protective film 29 of the array substrate 2, thus being different from a light-blocking layer formed by attaching what is called an external optical filter onto the protective film 29 of the array substrate 2. In the case of attaching the external optical filter onto the array substrate 2, it is highly difficult, in particular, to match the position of a small opening of a light-blocking layer corresponding to the first opening OP1 of the first light-blocking layer 71 of the present embodiment with the position of the partial photodiode 30S-1. In contrast, since the optical filter 7 of the present embodiment is directly formed on the protective film 29 of the array substrate 2, the first opening OP1 can be more accurately provided above the partial photodiode 30S-1 than in the case of attaching the external optical filter.

In addition, unlike the second light-blocking layer 72 formed of a resin material to be described later, the first light-blocking layer 71 is formed of a metal material. Therefore, the first light-blocking layer 71 can be formed to be thinner than the second light-blocking layer 72 and can have the first opening OP1 formed therein that is smaller than a second opening OP2 formed in the second light-blocking layer 72. The thickness of the first light-blocking layer 71 is equal to or less than one tenth the thickness of the second light-blocking layer 72. As an example, the thickness of the first light-blocking layer 71 is equal to or greater than 0.055 μm, and is, for example, 0.065 μm, and the thickness of the second light-blocking layer 72 is, for example, 1 μm. The first light-blocking layer 71 is formed to be much thinner than the second light-blocking layer 72.

The filter layer 73 is provided on the first light-blocking layer 71 so as to be directly in contact therewith. In other words, the filter layer 73 is provided between the first light-blocking layer 71 and the first light-transmitting resin layer 74 in the third direction Dz. The filter layer 73 covers also a region overlapping the first opening OP1 and contacts the protective film 29 of the array substrate 2 through the first opening OP1. The filter layer 73 is a filter that blocks light in a predetermined wavelength band. The filter layer 73 is, for example, an infrared (IR) cut filter that is formed of a resin material colored in green and blocks infrared rays. With this configuration, the optical filter 7 can increase the detection sensitivity by allowing, for example, components of the light L2 in a wavelength band required for the fingerprint detection to enter the photodiode 30.

The first light-transmitting resin layer 74 is provided on the filter layer 73 so as to be directly in contact therewith. In other words, the first light-transmitting resin layer 74 is provided between the first light-blocking layer 71 and the second light-blocking layer 72 in the third direction Dz. The first light-transmitting resin layer 74 and the second light-transmitting resin layer 75 are formed of, for example, a light-transmitting acrylic resin.

The second light-blocking layer 72 is provided on the first light-transmitting resin layer 74 so as to be directly in contact therewith. In other words, the second light-blocking layer 72 is provided between the first light-blocking layer 71 and the lens 78 in the third direction Dz. The second light-blocking layer 72 is provided with the second opening OP2 in a region overlapping the photodiode 30 and the first opening OP1. The second opening OP2 is formed in a region overlapping the optical axis CL. More preferably, the centers of the second opening OP2 and the first opening OP1 are provided so as to overlap the optical axis CL.

The second light-blocking layer 72 is formed of, for example, a resin material colored in black. With the above-described configuration, the second light-blocking layer 72 serves as a light-absorbing layer that absorbs the components of the light L2 traveling in the oblique directions other than the light L2 passing through the second opening OP2. The second light-blocking layer 72 also absorbs light reflected by the first light-blocking layer 71. With this configuration, as compared with a configuration in which the second light-blocking layer 72 is formed of a metal material, the light reflected by the first light-blocking layer 71 can be restrained from being repeatedly reflected a plurality of times to travel in the first light-transmitting resin layer 74 as stray light and entering the other photodiodes 30. The second light-blocking layer 72 can also absorb external light incident from between the adjacent lenses 78. As a result, as compared with the configuration in which the second light-blocking layer 72 is formed of a metal material, reflected light can be reduced in the second light-blocking layer 72. However, the second light-blocking layer 72 is not limited to the example of being formed of a resin material colored in black and may be formed of a metal material having blackened surfaces.

The second light-transmitting resin layer 75 is provided on the second light-blocking layer 72 so as to be directly in contact therewith. In other words, the second light-transmitting resin layer 75 is provided between the second light-blocking layer 72 and the lens 78. The second light-transmitting resin layer 75 covers also a region overlapping the second opening OP2 and contacts the first light-transmitting resin layer 74 through the second opening OP2.

The second light-transmitting resin layer 75 is formed using the same material as that of the first light-transmitting resin layer 74, and the refractive index of the second light-transmitting resin layer 75 is substantially equal to that of the first light-transmitting resin layer 74. As a result, the light L2 can be restrained from being reflected on an interface between the first light-transmitting resin layer 74 and the second light-transmitting resin layer 75 in the second opening OP2. However, the first light-transmitting resin layer 74 and the second light-transmitting resin layer 75 are not limited to this configuration and may be formed of different materials, and the refractive index of the first light-transmitting resin layer 74 may differ from that of the second light-transmitting resin layer 75.

In the present embodiment, the width decreases in the order of a width W3 (diameter) in the first direction Dx of the lens 78, a width W2 (diameter) in the first direction Dx of the second opening OP2, and the width W1 (diameter) in the first direction Dx of the first opening OP1. The width W1 (diameter) in the first direction Dx of the first opening OP1 is less than the width in the first direction Dx of the partial photodiode 30S-1 of the photodiode 30. The width W1 is from 2 μm to 10 μm, and is, for example, approximately 3.5 μm. The width W2 is from 3 μm to 20 μm, and is, for example, approximately 10.0 μm. The width W3 is from 10 μm to 50 μm, and is, for example, approximately 21.9 μm.

A thickness t2 of the second light-transmitting resin layer 75 illustrated in FIG. 6 is set to be substantially the same as a thickness t1 of the first light-transmitting resin layer 74 or less than the thickness t1 of the first light-transmitting resin layer 74. The thickness t1 of the first light-transmitting resin layer 74 and the thickness t2 of the second light-transmitting resin layer 75 are set to be greater than a thickness t4 of the filter layer 73. The thickness t1 of the first light-transmitting resin layer 74 and the thickness t2 of the second light-transmitting resin layer 75 are greater than a thickness t3 of the protective film 29 of the array substrate 2. The thickness t1 and the thickness t2 are from 3 μm to 30 μm. The thickness t1 is, for example, approximately 18 μm. The thickness t2 is, for example, approximately 16.5 μm. The thickness t3 is from 1 μm to 10 μm, and is, for example, equal to or larger than 4.5 μm. The thickness t4 of the filter layer 73 is exemplarily from 1 μm to 5 μm, and is, for example, 1.35 μm.

With the above-described configuration, light L2-1 traveling in the third direction Dz among beams of the light L2 reflected by the object to be detected such as the finger Fg is condensed by the lens 78, and passes through the second opening OP2 and the first opening OP1 to enter the photodiode 30. Light L2-2 that tilts by an angle θ1 from the third direction Dz also passes through the second opening OP2 and the first opening OP1 to enter the photodiode 30.

Figure 7:
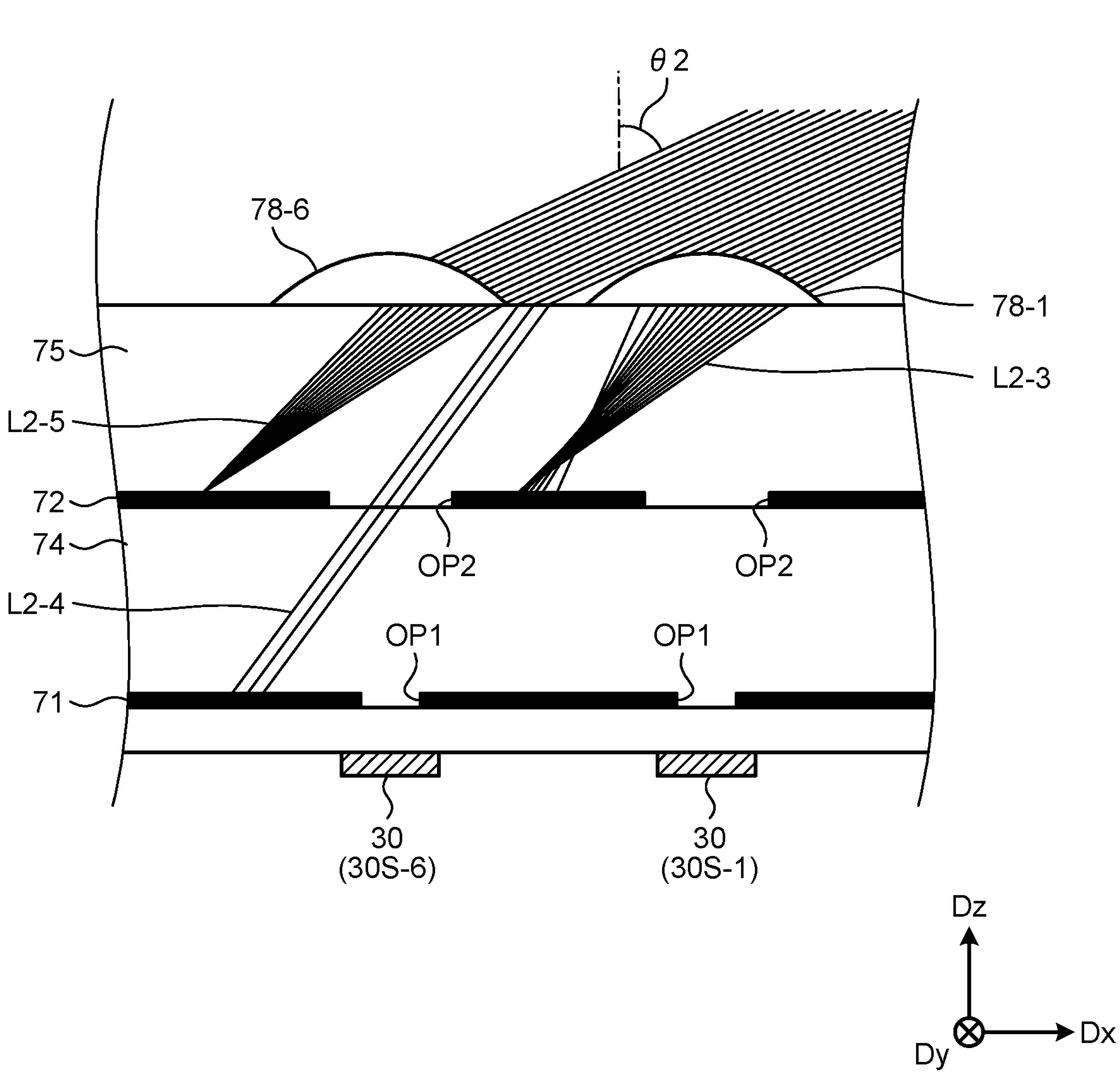
FIG. 7 is an explanatory diagram for schematically explaining travel of light when the light is incident in an oblique direction on the optical filter.

FIG. 7 is an explanatory diagram for schematically explaining travel of light when the light is incident in an oblique direction on the optical filter. FIG. 7 schematically illustrates a sectional structure of the two adjacent lenses 78-1 and 78-6. The lenses 78-1 and 78-6 are provided in positions overlapping partial photodiodes 30S-1 and 30S-6, respectively, of the photodiode 30. FIG. 7 also illustrates a case where the light L2 traveling in a direction oblique to the third direction Dz is incident on the optical filter 7. In the example illustrated in FIG. 7, an angle θ2 formed by the light L2 and the third direction Dz is 65 degrees.

As illustrated in FIG. 7, the light L2 that has entered the lenses 78-1 and 78-6 in the oblique direction is condensed as light L2-3 and L2-5, respectively, and is blocked by the second light-blocking layer 72. The light L2 that has entered the second light-transmitting resin layer 75 between the adjacent lenses 78 is refracted at the upper surface of the second light-transmitting resin layer 75, and travels as light L2-4 in the second light-transmitting resin layer 75. Part of the light L2-4 is blocked by the second light-blocking layer 72. Components of the light L2-4 that have passed through the second opening OP2 are blocked by the first light-blocking layer 71.

As described above, since the first light-blocking layer 71 and the second light-blocking layer 72 are provided, the optical filter 7 can reduce occurrence of what is called crosstalk by blocking the light L2 incident from the oblique direction more effectively than in a case where the optical filter 7 is formed including only one light-blocking layer (for example, in a case where the optical filter 7 is not provided with the second light-blocking layer 72 and is formed including only the first light-blocking layer 71 in FIG. 7).

Even in the case where the first light-blocking layer 71 and the second light-blocking layer 72 are provided, the light L2 incident in the direction parallel to the third direction Dz can efficiently enter the partial photodiodes 30S by being restrained from being blocked by the first light-blocking layer 71 and the second light-blocking layer 72. As described above, the detection device 1 can reduce the occurrence of the crosstalk to improve the detection accuracy.

As illustrated in FIG. 6, the width W2 of the second opening OP2 is set to be greater than the width W1 of the first opening OP1, and the thickness t2 is set to be substantially equal to or less than the thickness t1. If the thickness t2 is set to be greater than the thickness t1, the second light-blocking layer 72 is disposed in a position farther from the lens 78 in the third direction Dz. As a result, in the structure in which each of the photodiodes 30 includes the partial photodiodes 30S and the second opening OP2 is provided for each of the partial photodiodes 30S as illustrated in FIG. 5, the second light-blocking layer 72 may be less capable of sufficiently blocking the light L2 that has passed through the lens 78 and travels in the oblique directions as the film thickness of the second light-transmitting resin layer 75 is greater. This phenomenon is more significant as the lenses 78 are more densely arranged in each of the detection elements 3. In the present embodiment, since the thickness t2 is set to be less than the thickness t1, the light L2 traveling in the direction parallel to the third direction Dz can enter the photodiode 30, and the light L2 in the oblique directions can be effectively blocked.

The present embodiment is not limited to the example illustrated in FIG. 6. The second light-blocking layer 72 may be formed to be thinner than the first light-blocking layer 71. The film thickness of the second light-blocking layer 72 can be changed as appropriate depending on characteristics, including the width W2 of the second opening OP2, required for the optical filter 7. The thickness t2 of the second light-transmitting resin layer 75 can be changed as appropriate depending on the characteristics required for the optical filter 7.

Depending on the angle of the incident light, the light may pass through both the second opening OP2 and the first opening OP1 to reach the photodiode 30. Even in this case, the above-described configuration restrains the light incident in the oblique directions to a much smaller light quantity than the light quantity of the light L2 incident in the direction parallel to the third direction Dz.

The optical filter 7 is integrally formed with the array substrate 2. That is, the first light-blocking layer 71 of the optical filter 7 is provided on the protective film 29 so as to be directly in contact therewith, and any member such as an adhesive layer is not provided between the first light-blocking layer 71 and the protective film 29. The optical filter 7 is directly formed as a film on the array substrate 2 and is formed by being subjected to a process such as patterning. Thus, the positional accuracy of the first opening OP1, the second opening OP2, and the lens 78 of the optical filter 7 with respect to the photodiode 30 can be improved as compared with a case where the optical filter 7 is attached as a separate component to the array substrate 2.

Figure 8:
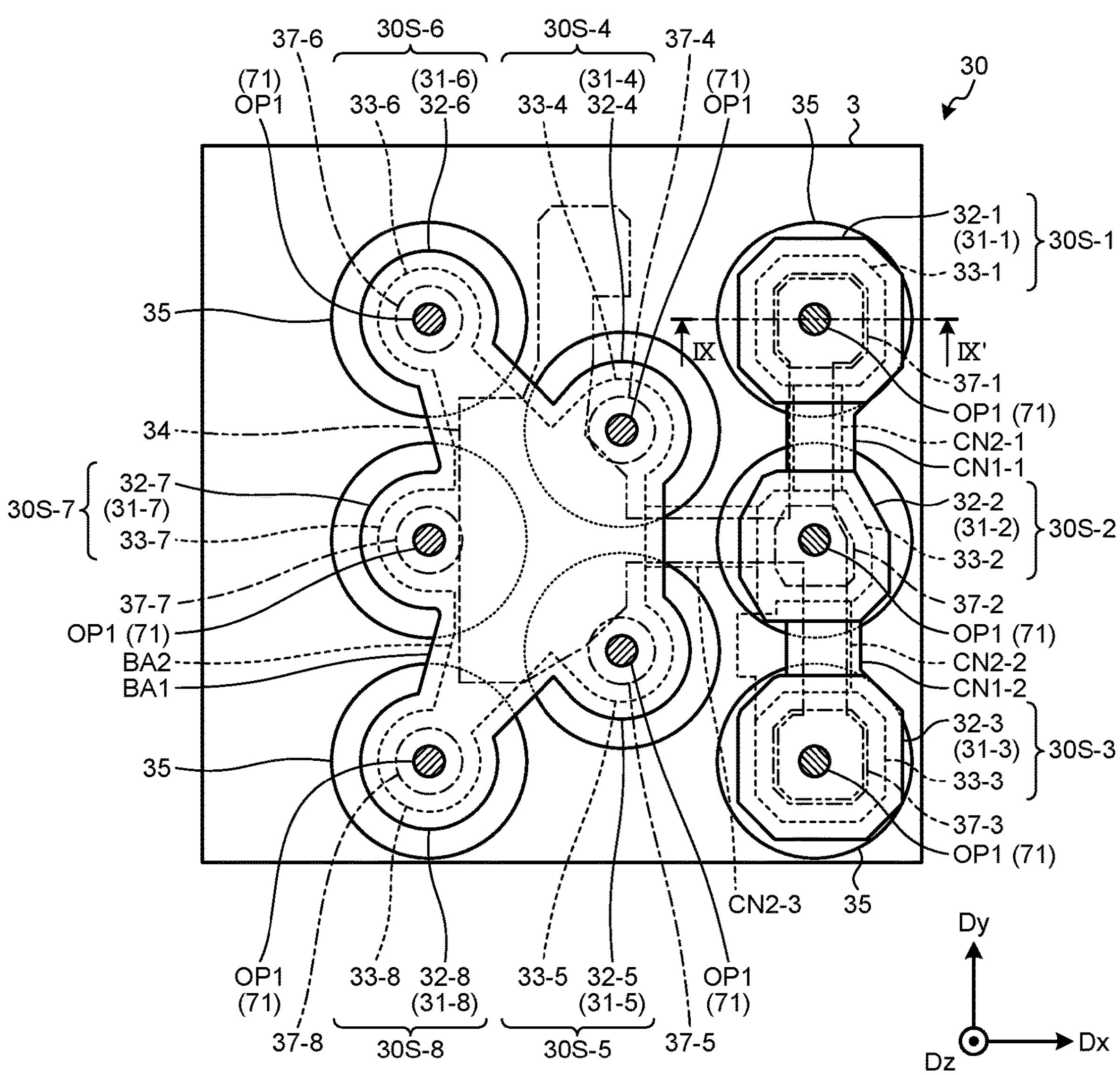
FIG. 8 is a plan view illustrating the detection element.

FIG. 8 is a plan view illustrating the detection element. For ease of viewing, FIG. 8 is illustrated without the transistors included in the detection element 3 and the various types of wiring including, for example, the scan lines and the signal lines. Each of the detection elements 3 is defined, for example, as a region surrounded by the scan lines and the signal lines.

As illustrated in FIG. 8, the photodiode 30 includes a plurality of partial photodiodes 30S-1, 30S-2, . . . , 30S-8. The partial photodiodes 30S-1, 30S-2, . . . , 30S-8 are arranged in a triangular lattice pattern. The lenses 78-1, 78-2, . . . , 78-8, the first openings OP1 of the first light-blocking layer 71, and the second openings OP2 of the second light-blocking layer 72 illustrated in FIG. 5 are provided so as to overlap the respective partial photodiodes 30S-1, 30S-2, . . . , 30S-8.

More specifically, the partial photodiodes 30S-1, 30S-2, and 30S-3 are arranged in the second direction Dy. The partial photodiodes 30S-4 and 30S-5 are arranged in the second direction Dy and are adjacent in the first direction Dx to an element column made up of the partial photodiodes 30S-1, 30S-2, and 30S-3. The partial photodiodes 30S-6, 30S-7, and 30S-8 are arranged in the second direction Dy and are adjacent in the first direction Dx to an element column made up of the partial photodiodes 30S-4 and 30S-5. The positions in the second direction Dy of the partial photodiodes 30S are arranged in a staggered manner between the adjacent element columns.

The light L2 is incident on the partial photodiodes 30S-1, 30S-2, . . . , 30S-8 from the lenses 78-1, 78-2, . . . , 78-8, respectively. The partial photodiodes 30S-1, 30S-2, . . . , 30S-8 are electrically coupled to one another to serves as one photodiode 30. That is, the signals output from the respective partial photodiodes 30S-1, 30S-2, 30S-8 are integrated and output as one detection signal Vdet from the photodiode 30. In the following description, the partial photodiodes 30S-1, 30S-2, . . . , 30S-8 will be simply referred to as the partial photodiodes 30S when they need not be distinguished from one another.

Each of the partial photodiodes 30S includes an i-type semiconductor layer 31, an n-type semiconductor layer 32, and a p-type semiconductor layer 33. The i-type semiconductor layer 31 and the n-type semiconductor layer 32 are formed of, for example, amorphous silicon (a-Si). The p-type semiconductor layer 33 is formed of, for example, polysilicon (p-Si). The material of each of the semiconductor layers is not limited to those mentioned above and may be, for example, polysilicon or microcrystalline silicon.

The a-Si of the n-type semiconductor layer 32 is doped with impurities to form an n+ region. The p-Si of the p-type semiconductor layer 33 is doped with impurities to form a p+ region. The i-type semiconductor layer 31 is, for example, a non-doped intrinsic semiconductor, and has lower electric conductivity than that of the n-type semiconductor layer 32 and the p-type semiconductor layer 33.

FIG. 8 uses a long dashed short dashed line to illustrate an effective sensor region 37 in which the p-type semiconductor layer 33 is coupled to the i-type semiconductor layer 31 (n-type semiconductor layer 32). The first opening OP1 of the first light-blocking layer 71 is provided so as to overlap the sensor region 37.

The partial photodiodes 30S have different shapes from one another in the plan view. The partial photodiodes 30S-1, 30S-2, and 30S-3 are each formed in a polygonal shape. The partial photodiodes 30S-4, 30S-5, 30S-6, 30S-7, and 30S-8 are each formed in a circular shape or a semi-circular shape.

The n-type semiconductor layers 32 of the partial photodiodes 30S-1, 30S-2, and 30S-3 arranged in the second direction Dy are electrically coupled together by coupling portions CN1-1 and CN1-2. The p-type semiconductor layers 33 of the partial photodiodes 30S-1, 30S-2, and 30S-3 are electrically coupled together by coupling portions CN2-1 and CN2-2.

The n-type semiconductor layers 32 (i-type semiconductor layers 31) of the partial photodiodes 30S-4, 30S-5, 30S-6, 30S-7, and 30S-8 are electrically coupled together by a base portion BA1. The p-type semiconductor layers 33 of the partial photodiodes 30S-4, 30S-5, 30S-6, 30S-7, and 30S-8 are electrically coupled together by a base portion BA2. Each of the base portions BA1 and BA2 is formed in a substantially pentagonal shape and is provided, in the apex positions thereof, with the partial photodiodes 30S-4, 30S-5, 30S-6, 30S-7, and 30S-8. A coupling portion CN2-3 electrically couples the base portion BA2 to the p-type semiconductor layers 33 of the partial photodiodes 30S-1, 30S-2, and 30S-3. With the above-described configuration, the partial photodiodes 30S constituting one photodiode 30 are electrically coupled together.

The lower conductive layer 35 is provided in each of respective regions overlapping the partial photodiodes 30S. The lower conductive layers 35 all have a circular shape in the plan view. That is, the lower conductive layer 35 may have a shape different from that of the partial photodiode 30S. For example, each of the partial photodiodes 30S-1, 30S-2, and 30S-3 has a polygonal shape in the plan view and is formed above the circular lower conductive layer 35. Each of the partial photodiodes 30S-4, 30S-5, 30S-6, 30S-7, and 30S-8 has a circular shape or a semi-circular shape having a diameter less than that of the lower conductive layer 35 in the plan view and is formed above the circular lower conductive layer 35. The lower conductive layer 35 is supplied with the reference potential VCOM that is the same as the potential of the p-type semiconductor layer 33, and thus, can reduce the parasitic capacitance between the lower conductive layer 35 and the p-type semiconductor layer 33.

The upper conductive layer 34 electrically couples together the n-type semiconductor layers 32 of the partial photodiodes 30S. The upper conductive layer 34 is electrically coupled to the transistors (the reset transistor Mrst and the source follower transistor Msf (refer to FIG. 4)) of the array substrate 2. The upper conductive layer 34 may be provided in any manner and may be provided, for example, so as to cover a portion of the partial photodiode 30S, or so as to cover the entire partial photodiode 30S.

In the present embodiment, the partial photodiode 30S is provided for each of the lenses 78 and each of the first openings OP1. As compared with a configuration in which the photodiode 30 is formed of a solid film having, for example, a quadrilateral shape so as to cover the entire detection element 3 in the plan view, this configuration can reduce the semiconductor layers and the wiring layers in a region not overlapping the lenses 78 and the first openings OP1, and therefore, can reduce the parasitic capacitance of the photodiode 30.

The planar structure of the photodiode 30 illustrated in FIG. 8 is merely an example, and can be changed as appropriate. The number of the partial photodiodes 30S included in one photodiode 30 may be seven or smaller, or nine of larger. The partial photodiodes 30S are not limited to being arranged in a triangular lattice pattern, and may be arranged in a matrix having a row-column configuration, for example. The arrangement of the lenses 78, the first openings OP1, and the second openings OP2 included in the optical filter 7 can also be changed as appropriate depending on the configuration of the partial photodiodes 30S.

Figure 9:
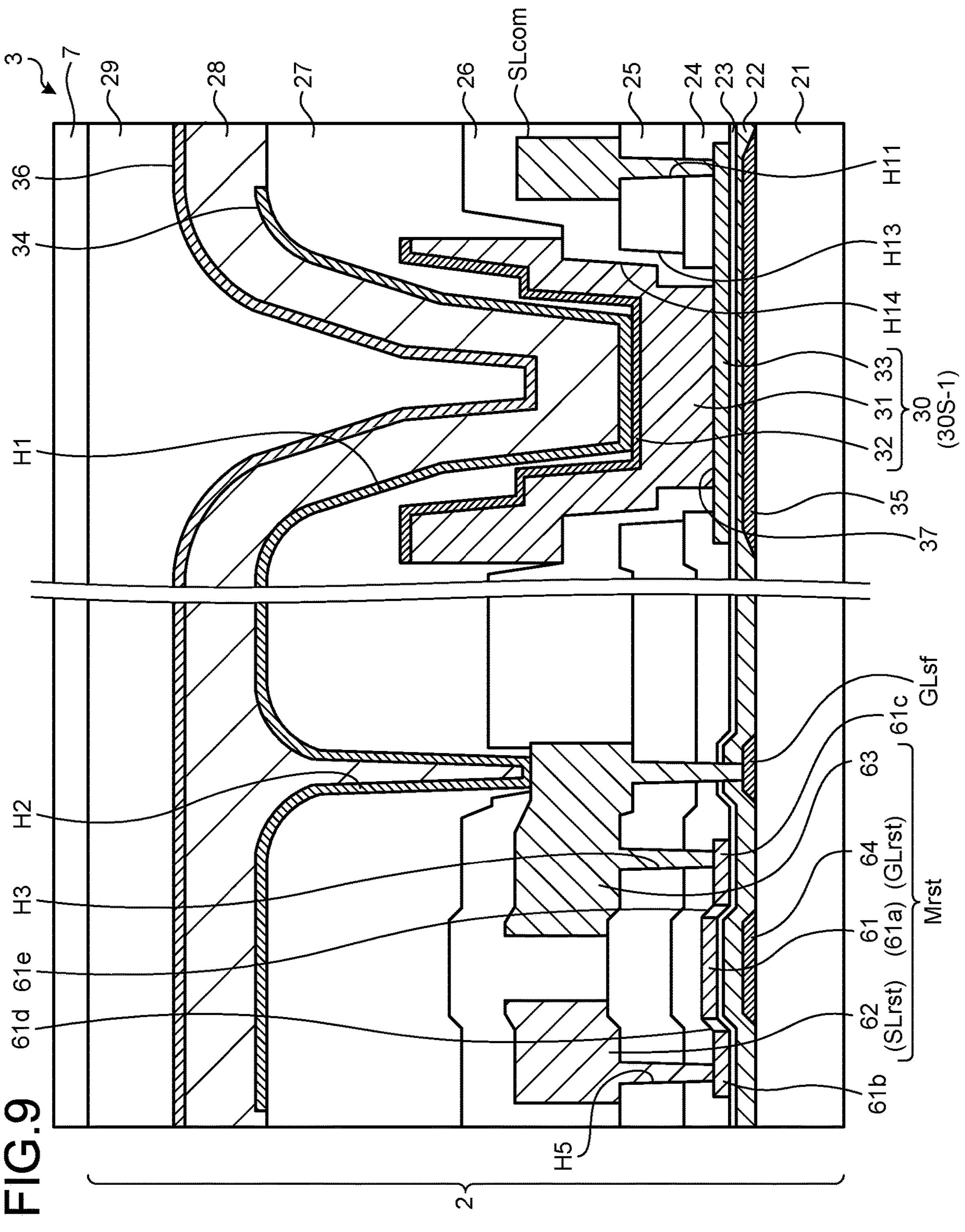
FIG. 9 is a IX-IX' sectional view of FIG. 8.

FIG. 9 is a IX-IX' sectional view of FIG. 8. FIG. 9 illustrates the sectional configuration of the reset transistor Mrst included in the detection element 3 together with the sectional configuration of the partial photodiode 30S-1. Each of the source follower transistor Msf and the read transistor Mrd included in the detection element 3 also has a sectional configuration similar to that of the reset transistor Mrst.

The substrate 21 is an insulating substrate, and a glass substrate of, for example, quartz or alkali-free glass, or a resin substrate of, for example, polyimide is used as the substrate 21. A gate electrode 64 is provided on the substrate 21. Insulating films 22 and 23 are provided on the substrate 21 so as to cover the gate electrode 64. The insulating films 22 and 23 and insulating films 24, 25, and 26 are inorganic insulating films, and are formed of, for example, silicon oxide ($SiO_2$) or silicon nitride (SiN).

A semiconductor layer 61 is provided on the insulating film 23. For example, polysilicon is used as the semiconductor layer 61. The semiconductor layer 61 is, however, not limited thereto, and may be formed of, for example, a microcrystalline oxide semiconductor, an amorphous oxide semiconductor, or low-temperature polycrystalline silicon (LTPS). The reset transistor Mrst has a bottom-gate structure in which the gate electrode 64 is provided on the lower side of the semiconductor layer 61, but may have a top-gate structure in which the gate electrode 64 is provided on the upper side of the semiconductor layer 61, or a dual-gate structure in which the gate electrodes 64 are provided on the upper side and lower side of the semiconductor layer 61.

The semiconductor layer 61 includes a channel region 61*a*, high impurity concentration regions 61*b* and 61*c*, and low impurity concentration regions 61*d* and 61*e*. The channel region 61*a* is, for example, a non-doped intrinsic semiconductor or a low-impurity region and has lower electric conductivity than that of the high impurity concentration regions 61*b* and 61*c* and the low impurity concentration regions 61*d* and 61*e*. The channel region 61*a* is provided in a region overlapping the gate electrode 64.

The insulating films 24 and 25 are provided on the insulating film 23 so as to cover the semiconductor layer 61. A source electrode 62 and a drain electrode 63 are provided on the insulating film 25. The source electrode 62 is coupled to the high impurity concentration region 61*b* of the semiconductor layer 61 through a contact hole H5. The drain electrode 63 is coupled to the high impurity concentration region 61*c* of the semiconductor layer 61 through a contact hole H3. The source and the drain electrodes 62 and 63 are formed of, for example, a multilayered film of Ti—Al—Ti layers or Ti—Al layers that has a multilayered structure of titanium and aluminum.

A gate line GLsf is wiring coupled to the gate of the source follower transistor Msf. The gate line GLsf is provided in the same layer as that of the gate electrode 64. The drain electrode 63 (coupling wiring SLcn) is coupled to the gate line GLsf through a contact hole passing through the insulating films 22 to 25.

The following describes a sectional configuration of the photodiode 30. The partial photodiode 30S-1 will be described with reference to FIG. 9. However, the description of the partial photodiode 30S-1 is also applicable to the other partial photodiodes 30S-2, . . . , 30S-8. As illustrated in FIG. 9, the lower conductive layer 35 is provided in the same layer as that of the gate electrode 64 and the gate line GLsf on the substrate 21. The insulating films 22 and 23 are provided on the lower conductive layer 35. The photodiode 30 is provided on the insulating film 23. In other words, the lower conductive layer 35 is provided between the substrate 21 and the p-type semiconductor layer 33. The lower conductive layer 35 is formed of the same material as that of the gate electrode 64 to serve as a light-blocking layer, and thus, the lower conductive layer 35 can restrain light from entering the photodiode 30 from the substrate 21 side.

The i-type semiconductor layer 31 is provided between the p-type semiconductor layer 33 and the n-type semiconductor layer 32 in the third direction Dz. In the present embodiment, the p-type semiconductor layer 33, the i-type semiconductor layer 31, and the n-type semiconductor layer 32 are stacked in this order on the insulating film 23. The effective sensor region 37 illustrated in FIG. 8 is a region in which the i-type semiconductor layer 31 is coupled to the p-type semiconductor layer 33.

Specifically, the p-type semiconductor layer 33 is provided in the same layer as that of the semiconductor layer 61 on the insulating film 23. The insulating films 24, 25, and 26 are provided so as to cover the p-type semiconductor layer 33. The insulating films 24 and 25 are provided with a contact hole H13 in a position overlapping the p-type semiconductor layer 33. The insulating film 26 is provided on the insulating film 25 so as to cover the transistors including the reset transistor Mrst. The insulating film 26 covers side surfaces of the insulating films 24 and 25 constituting an inner wall of the contact hole H13. The insulating film 26 is provided with a contact hole H14 in a position overlapping the p-type semiconductor layer 33.

The i-type semiconductor layer 31 is provided on the insulating film 26, and is coupled to the p-type semiconductor layer 33 through the contact hole H14 passing through the insulating films 24 to 26. The n-type semiconductor layer 32 is provided on the i-type semiconductor layer 31.

An insulating film 27 is provided on the insulating film 26 so as to cover the photodiode 30. The insulating film 27 is provided so as to directly contact the photodiode 30 and the insulating film 26. The insulating film 27 is formed of an organic material such as a photosensitive acrylic. The insulating film 27 is thicker than the insulating film 26. The insulating film 27 has a better step coverage property than that of inorganic insulating materials, and is provided so as to cover side surfaces of the i-type semiconductor layer 31 and the n-type semiconductor layer 32.

The upper conductive layer 34 is provided on the insulating film 27. The upper conductive layer 34 formed of, for example, a light-transmitting conductive material such as indium tin oxide (ITO). The upper conductive layer 34 is provided along a surface of the insulating film 27, and is coupled to the n-type semiconductor layer 32 through a contact hole H1 provided in the insulating film 27. The upper conductive layer 34 is electrically coupled to the drain electrode 63 of the reset transistor Mrst and the gate line GLsf through a contact hole H2 provided in the insulating film 27.

An insulating film 28 is provided on the insulating film 27 so as to cover the upper conductive layer 34. The insulating film 28 is an inorganic insulating film. The insulating film 28 is provided as a protective layer for restraining water from entering the photodiode 30. An overlapping conductive layer 36 is provided on the insulating film 28. The overlapping conductive layer 36 is formed of, for example, a light-transmitting conductive material such as ITO. The overlapping conductive layer 36 is a conductive layer for supplying the power supply potential VDD to the source follower transistor Msf and is electrically coupled to the source follower transistor Msf and so forth at any positions.

The protective film 29 is provided on the insulating film 28 so as to cover the overlapping conductive layer 36. The protective film 29 is an organic protective film. The protective film 29 is formed so as to planarize a surface of the detection device 1.

In the present embodiment, the p-type semiconductor layer 33 and the lower conductive layer 35 of the photodiode 30 are provided in the same layers as those of the transistors. Therefore, the manufacturing process can be simpler than in a case where the photodiode 30 is formed in layers different from those of the transistors.

The sectional configuration of the photodiode 30 illustrated in FIG. 9 is merely an example. The sectional configuration is not limited to this example. For example, the photodiode 30 may be provided in layers different from those of the transistors, or may be provided by stacking the p-type semiconductor layer 33, the i-type semiconductor layer 31, and the n-type semiconductor layer 32 in this order on the insulating film 26.

As described above, the detection device 1 of the present embodiment includes the substrate 21, the photodiodes 30 arranged on the substrate 21, and the optical filter 7 covering the photodiodes 30. The optical filter 7 includes the lenses 78 provided so as to overlap the respective photodiodes 30, the first light-blocking layer 71 provided between the photodiodes 30 and the lenses 78 and provided with the first openings OP1 in the regions overlapping the respective photodiodes 30, and the second light-blocking layer 72 provided between the first light-blocking layer 71 and the lenses 78 and provided with the second openings OP2 in the regions overlapping the respective photodiodes 30 and the respective first openings OP1. The first light-blocking layer 71 is formed of a metal material, and the second light-blocking layer 72 is formed of a resin material.

With this configuration, since the first light-blocking layer 71 and the second light-blocking layer 72 are provided between the photodiodes 30 and the lenses 78, the optical filter 7 can allow the light L2 traveling in the direction parallel to the third direction Dz to enter the photodiodes 30, and can also effectively block the light L2 in the oblique directions to reduce the occurrence of the crosstalk.

Figure 10:
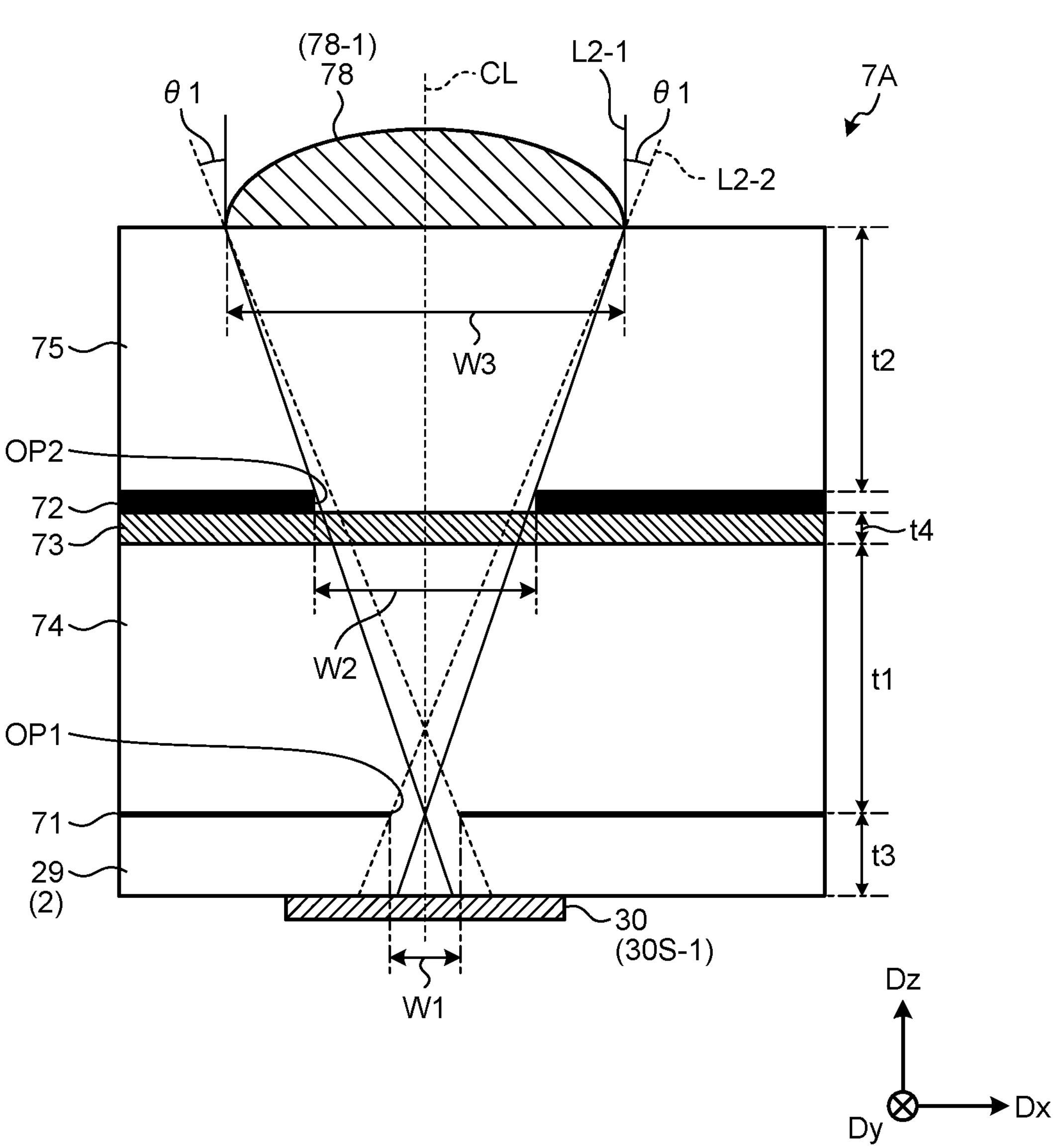
FIG. 10 is a sectional view illustrating an optical filter according to a fourth modification.

FIG. 10 is a sectional view illustrating an optical filter according to a fourth modification. In the following description, the same components as those described in the embodiment described above are denoted by the same reference numerals, and the description thereof will not be repeated.

In the embodiment described above, the filter layer 73 is provided between the first light-blocking layer 71 and the first light-transmitting resin layer 74 as illustrated in FIG. 6, but the position of the filter layer 73 is not limited thereto. As illustrated in FIG. 10, in an optical filter 7A, the filter layer 73 is provided on the first light-transmitting resin layer 74 so as to be directly in contact therewith. In other words, the filter layer 73 is provided between the first light-transmitting resin layer 74 and the second light-blocking layer 72 in the third direction Dz. The second light-blocking layer 72 is provided on the filter layer 73 so as to be directly in contact therewith. The second opening OP2 of the second light-blocking layer 72 is provided on the upper side of the filter layer 73, and the filter layer 73 contacts the second light-transmitting resin layer 75 through the second opening OP2.

In the present modification, the filter layer 73 is not provided on the first light-blocking layer 71, and the first light-transmitting resin layer 74 is provided on the first light-blocking layer 71 so as to be directly in contact therewith and contacts the protective film 29 of the array substrate 2 through the first opening OP1.

Figure 11:
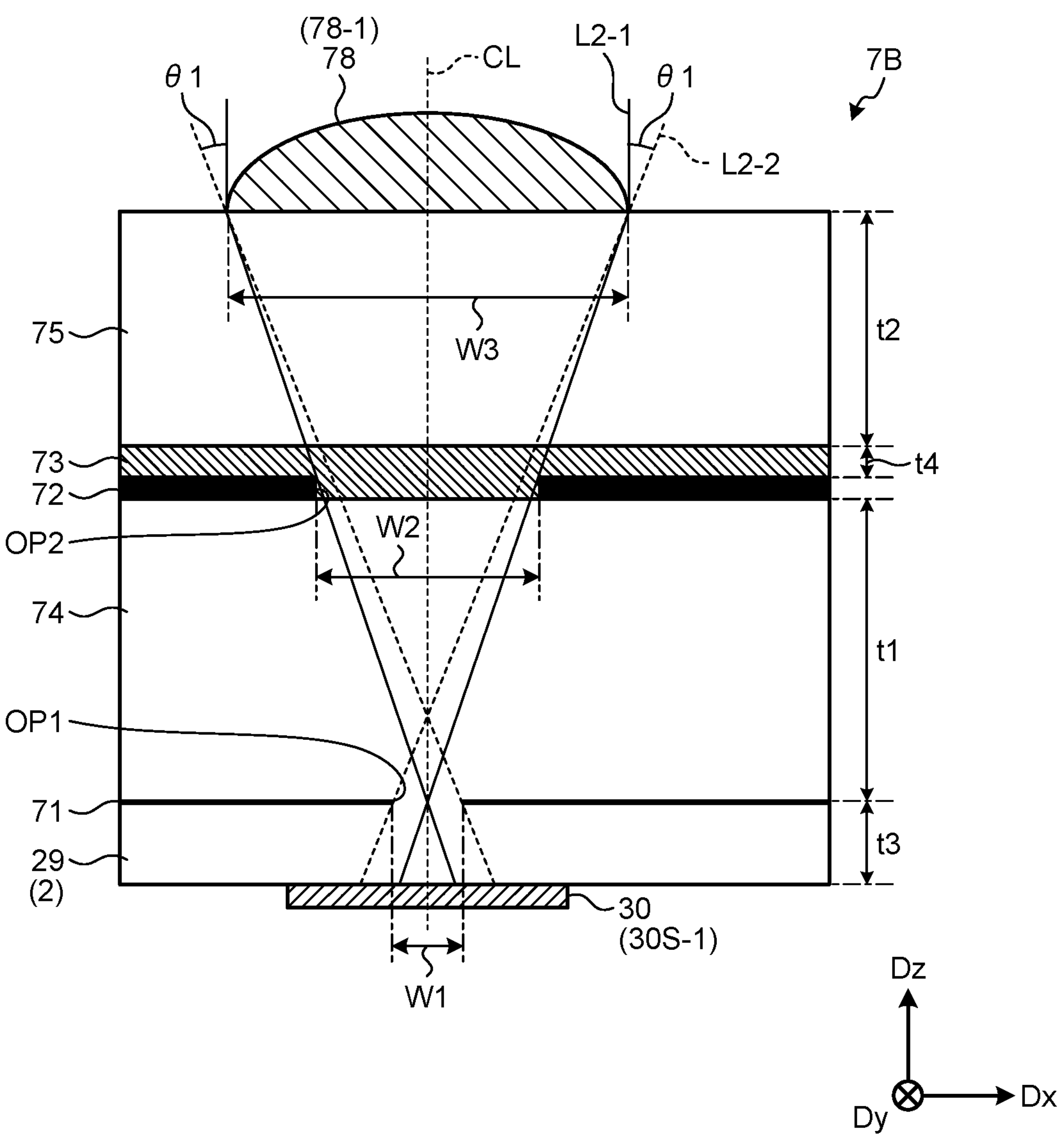
FIG. 11 is a sectional view illustrating an optical filter according to a fifth modification.

FIG. 11 is a sectional view illustrating an optical filter according to a fifth modification. In an optical filter 7B illustrated in FIG. 11, the filter layer 73 is provided on the second light-blocking layer 72 so as to be directly in contact therewith. In other words, the filter layer 73 is provided between the second light-blocking layer 72 and the second light-transmitting resin layer 75 in the third direction Dz. The filter layer 73 is provided so as to cover the second opening OP2 of the second light-blocking layer 72, and contacts the first light-transmitting resin layer 74 through the second opening OP2. The second light-transmitting resin layer 75 is provided on the filter layer 73 so as to be directly in contact therewith.

Figure 12:
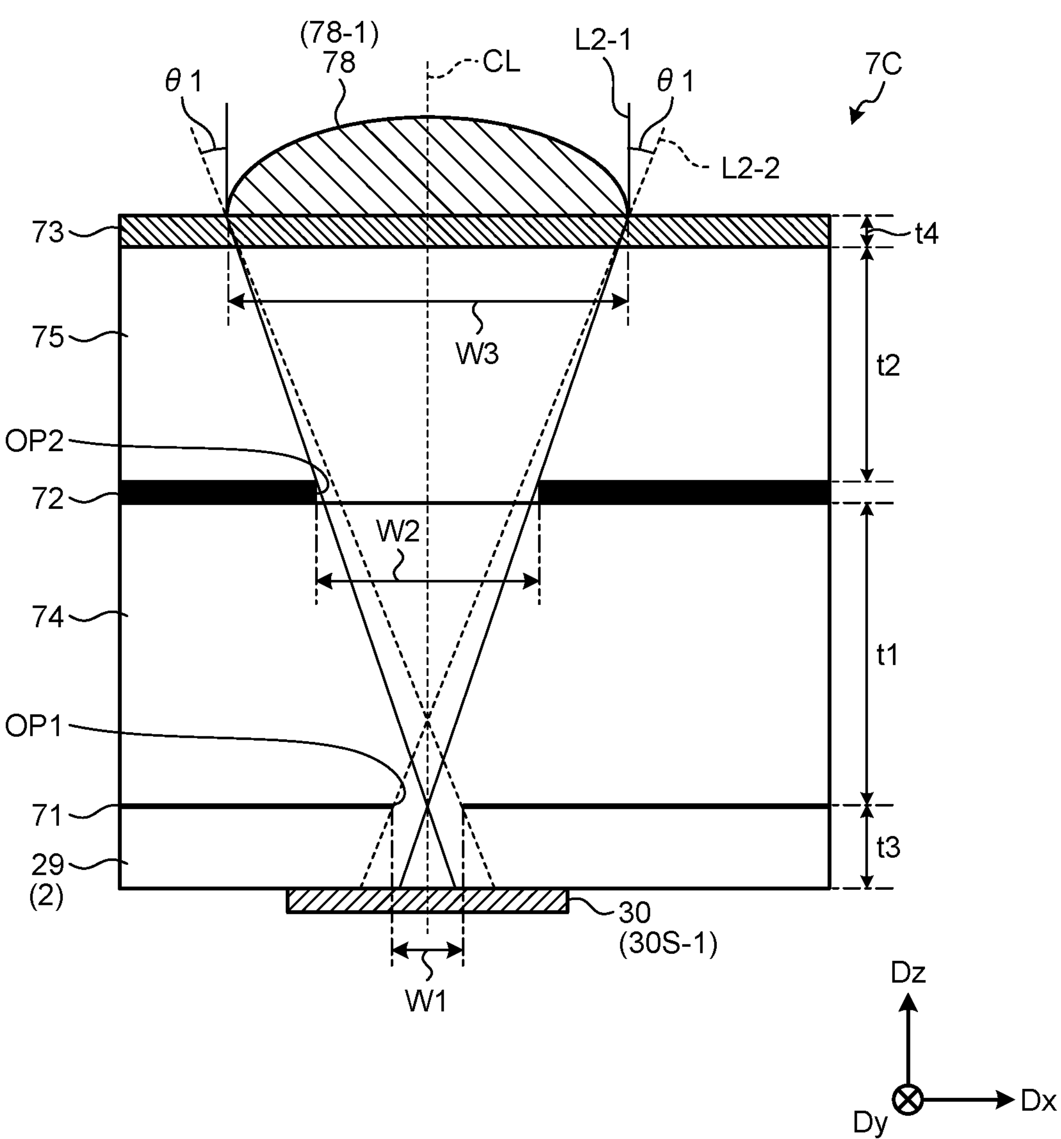
FIG. 12 is a sectional view illustrating an optical filter according to a sixth modification.

FIG. 12 is a sectional view illustrating an optical filter according to a sixth modification. In an optical filter 7C illustrated in FIG. 12, the filter layer 73 is provided on the second light-transmitting resin layer 75 so as to be directly in contact therewith. The lens 78 is provided on the filter layer 73 so as to be directly in contact therewith. In the present modification, the filter layer 73 is provided so as not to directly overlap either of the first opening OP1 of the first light-blocking layer 71 and the second opening OP2 of the second light-blocking layer 72. The protective film 29, the first light-transmitting resin layer 74, and the second light-transmitting resin layer 75 are stacked in this order along the optical axis CL.

The thickness t4 of the filter layer 73 is sufficiently less than the thickness t1 of the first light-transmitting resin layer 74 and the thickness t2 of the second light-transmitting resin layer 75. Therefore, the first opening OP1 of the first light-blocking layer 71 and the second opening OP2 of the second light-blocking layer 72 need not be largely changed even when the stacking position of the filter layer 73 is changed as illustrated in the fourth to the sixth modifications.

Figure 13:
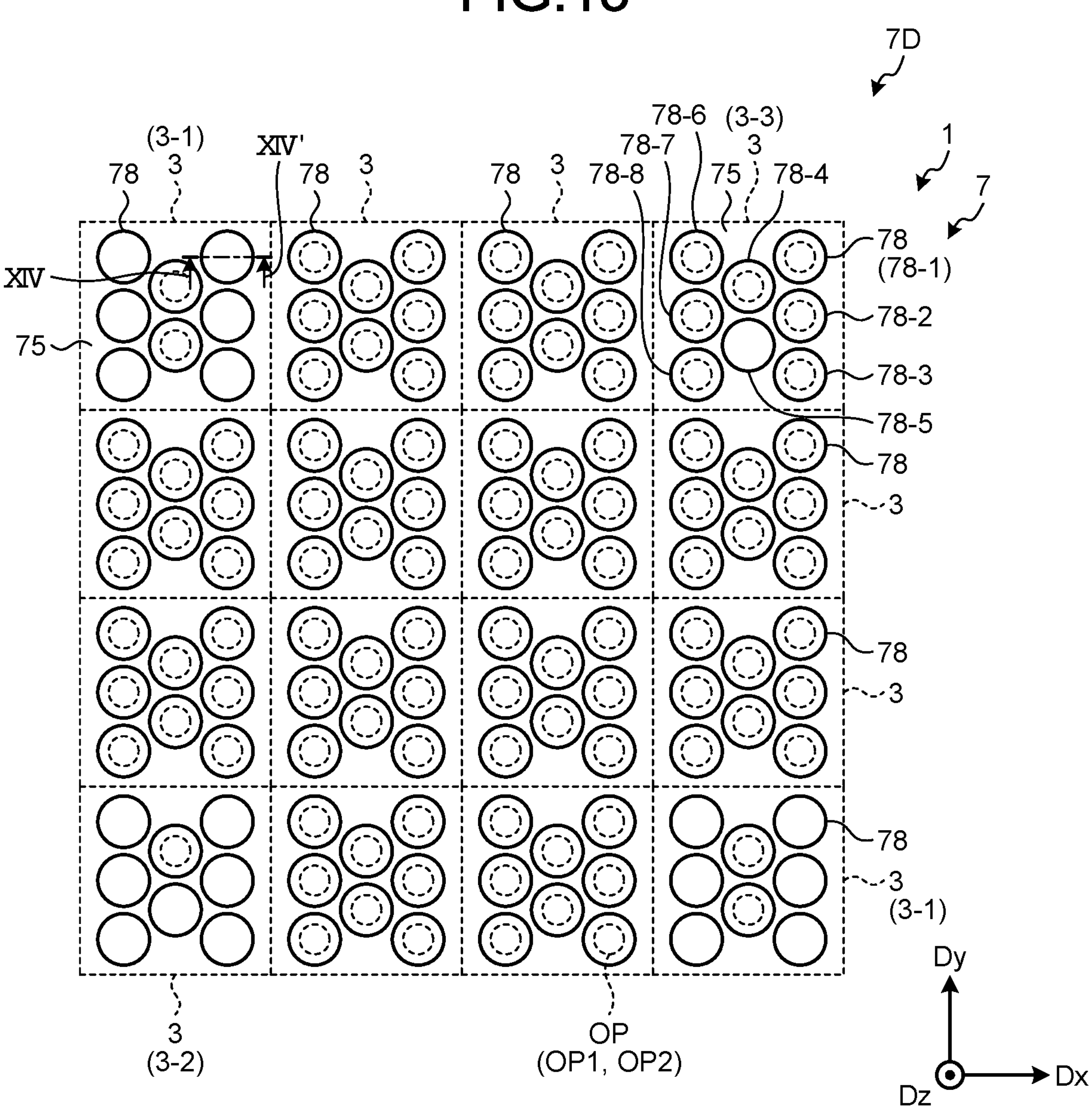
FIG. 13 is a plan view illustrating an optical filter according to a seventh modification.

FIG. 13 is a plan view illustrating an optical filter according to a seventh modification. An optical filter 7D illustrated in FIG. 13 differs in that the relation between lenses and openings OP of the light-blocking layer differs depending on the detection element 3. The openings OP are intended to be either the first openings OP1 or the second openings OP2, or both of the first openings OP1 and the second openings OP2, and in particular, represent openings that are not distinguished between the first and the second openings OP1 and OP2. That is, in the embodiment illustrated in FIGS. 5 and 6, the number of the lenses 78, the number of the first openings OP1, and the number of the second openings OP2 in one detection element 3 are the same for all the detection elements 3, whereas in FIG. 13, when comparing, for example, the detection element 3 with a detection element 3-1, the number of the openings OP in the detection element 3 differs from that of the detection element 3-1.

In the detection element 3 (first detection element) in FIG. 13, one photodiode 30 (first photodiode) includes eight partial photodiodes 30S, includes the first and the second openings OP1 and OP2 overlapping each of the eight partial photodiodes 30S, and includes the lenses 78 (78-1 to 78-8) overlapping the eight respective partial photodiodes 30S.

In contrast, in the detection element 3-1 (second detection element) in FIG. 13, one photodiode 30 (second photodiode) includes eight partial photodiodes 30S, includes the lenses 78 (78-1 to 78-8) overlapping the eight respective partial photodiodes 30S, and includes the first and the second openings OP1 and OP2 overlapping each of two partial photodiodes 30S-4 and 30S-5 (refer to FIG. 8) of the eight partial photodiodes 30S, and no openings OP are formed for six partial photodiodes 30S-1, 30S-2, 30S-3, 30S-6, 30S-7, and 30S-8 (refer to FIG. 8).

In a similar manner, in the detection element 3-2 in FIG. 13, one photodiode 30 includes eight partial photodiodes 30S and the lenses 78 (78-1 to 78-8) overlapping the eight respective partial photodiodes 30S, and includes the first and the second openings OP1 and OP2 overlapping one partial photodiodes 30S-4 of the eight partial photodiodes 30S, and no openings OP are formed for seven partial photodiodes 30S-1, 30S-2, 30S-3, 30S-5, 30S-6, 30S-7, and 30S-8.

Furthermore, in a detection element 3-3 in FIG. 13, one photodiode 30 includes eight partial photodiodes 30S and the lenses 78 (78-1 to 78-8) overlapping the eight respective partial photodiodes 30S, and includes the first and the second openings OP1 and OP2 overlapping each of seven partial photodiodes 30S-1, 30S-2, 30S-3, 30S-4, 30S-6, 30S-7, and 30S-8 of the eight partial photodiodes 30S, and no opening OP is formed for one partial photodiode 30S-5.

In this manner, the detection intensity can be changed for each of the detection elements 3 by changing the number of the openings OP for each of the detection elements 3.

Figure 14:
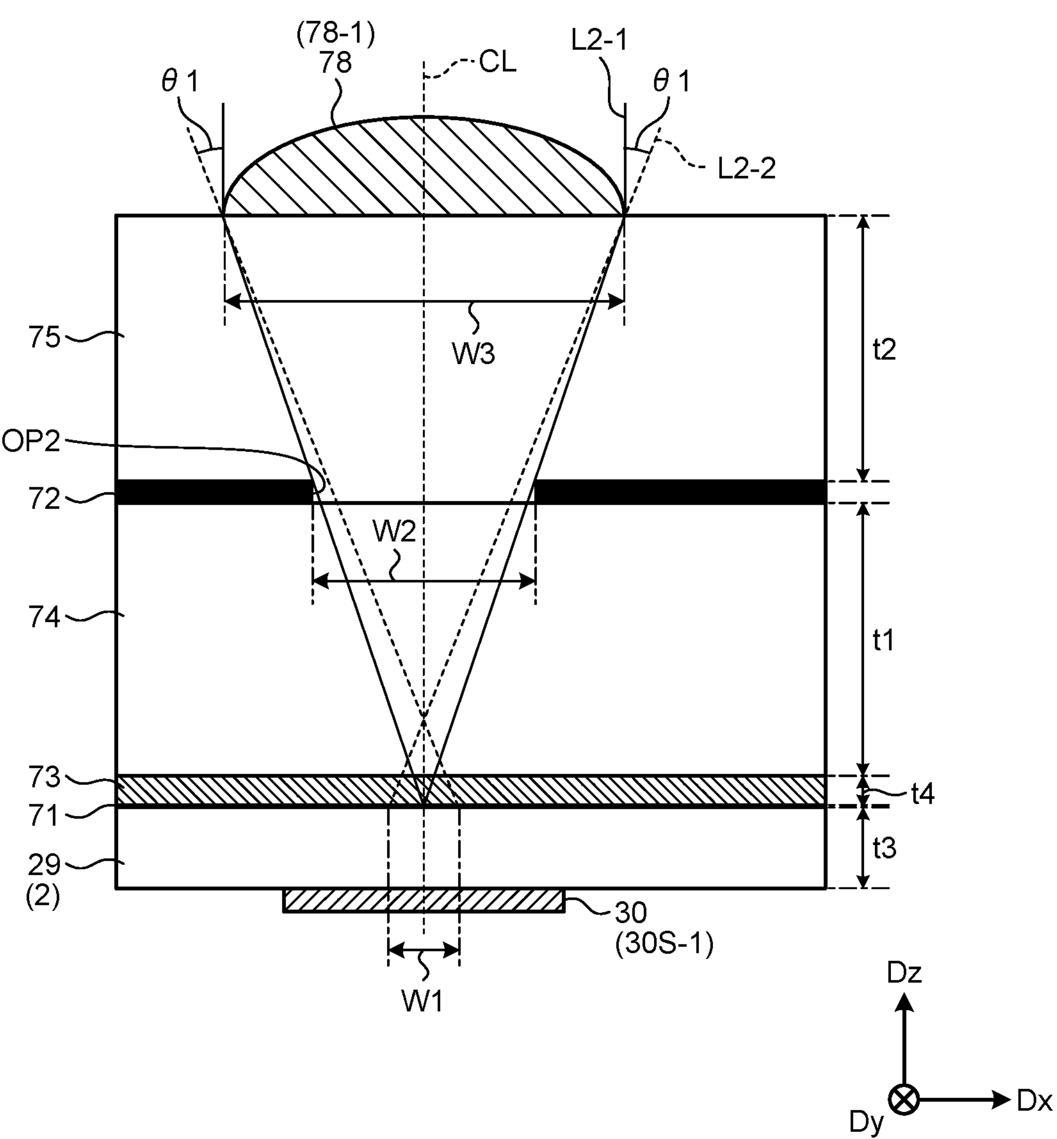
FIG. 14 is a XIV-XIV' sectional view of FIG. 13.

FIG. 14 is a XIV-XIV' sectional view of FIG. 13. The lens 78-1 and the second opening OP2 are formed above the partial photodiode 30S-1 of the detection element 3-1 in FIG. 13, but the first opening OP1 is not formed. That is, the partial photodiode 30S-1 is fully covered by the first light-blocking layer 71. The portion where no opening OP is formed is not limited to the example in which the first opening OP1 of the first light-blocking layer 71 is not formed as illustrated in FIG. 14, and may include a structure in which the first light-blocking layer 71 is formed, but the second opening OP2 is not formed. Furthermore, the structure may be such that neither of the first and the second openings OP1 and OP2 are formed. However, in order to vary the detection intensity at the detection element 3-1 from that at the other detection elements 3, the first opening OP1 is preferably not formed in the first light-blocking layer 71 near the partial photodiode 30S so that the first light-blocking layer 71 fully blocks the light L2-1 and L2-2 transmitted through the second opening OP2 of the detection element 3 in order to surely prevent the light L2-1 and L2-2 from entering the partial photodiode 30S-1 of the detection element 3-1.

In order to vary the detection intensity, the lenses 78 can be omitted at locations where no openings OP are formed above the partial photodiodes 30S as illustrated in FIGS. 13 and 14. However, in order to keep the uniformity of the lens shape in the detection element 3, it is preferable, in manufacturing, to form the lenses 78 even above the partial photodiodes 30S that do not detect light.

While the preferred embodiment of the present disclosure have been described above, the present disclosure is not limited to the embodiment described above. The content disclosed in the embodiment is merely an example, and can be variously modified within the scope not departing from the gist of the present disclosure. Any modifications appropriately made within the scope not departing from the gist of the present disclosure also naturally belong to the technical scope of the present disclosure. At least one of various omissions, substitutions, and changes of the components can be made without departing from the gist of the embodiment and the modifications described above.

What is claimed is:

1. A detection device comprising:
- a glass substrate;
- a first detection element comprising a first photodiode and a second detection element comprising a second photodiode, the first detection element and the second detection element being formed in a detection region on the glass substrate;
- a light-blocking layer overlapping the first photodiode and the second photodiode in the detection region and having a plurality of openings; and
- a plurality of lenses overlapping each of the first photodiode and the second photodiode, wherein
- each of the first photodiode and the second photodiode comprises a plurality of partial photodiodes,
- the number of the partial photodiodes of the first photodiode is equal to the number of the partial photodiodes of the second photodiode,
- the number of the openings that overlap the partial photodiodes of the first photodiode in the first detection element differs from the number of the openings that overlap the partial photodiodes of the second photodiode in the second detection element,
- each of the first photodiode and the second photodiode further includes a coupling portion coupling the partial photodiodes,
- a length of the coupling portion in a first direction perpendicular to an extending direction of the coupling portion, is less than a length of each of the partial photodiodes in the first direction, and
- none of the openings is provided in an area overlapping the coupling portion.

2. The detection device according to claim 1, wherein
- the number of the lenses that overlap the first photodiode is equal to the number of the lenses that overlap the second photodiode.

3. The detection device according to claim 1, wherein
- the light-blocking layer comprises a first light-blocking layer and a second light-blocking layer,
- the first light-blocking layer is formed of a metal material and has a first opening in regions overlapping the respective partial photodiodes,
- the second light-blocking layer is formed of a resin material and has a second opening in regions overlapping the respective partial photodiodes, and
- a thickness of the first light-blocking layer is less than a thickness of the second light-blocking layer.

4. The detection device according to claim 3, further comprising a filter layer configured to block light in a predetermined wavelength band, a first light-transmitting resin layer, and an organic protective film wherein
- the filter layer is provided between the first light-blocking layer and the first light-transmitting resin layer and contacts the organic protective film through the first opening.

5. The detection device according to claim 3, further comprising a filter layer configured to block light in a predetermined wavelength band, a first light-transmitting resin layer, and a second light-transmitting resin layer wherein
- the filter layer is provided between the first light-transmitting resin layer and the second light-blocking layer and contacts the second light-transmitting resin layer through the second opening.

6. The detection device according to claim 5, wherein a thickness of the first light-transmitting resin layer is less than a thickness of the second light-transmitting resin layer.

7. The detection device according to claim 5, wherein the thickness of the first light-blocking layer is equal to or less than one tenth the thickness of the second light-blocking layer.

8. The detection device according to claim 3, further comprising a filter layer configured to block light in a predetermined wavelength band, a first light-transmitting resin layer, and a second light-transmitting resin layer wherein the filter layer is provided between the second light-blocking layer and the second light-transmitting resin layer, and contacts the first light-transmitting resin layer through the second opening.

9. The detection device according to claim 8, wherein a thickness of the first light-transmitting resin layer is less than a thickness of the second light-transmitting resin layer.

10. The detection device according to claim 8, wherein the thickness of the first light-blocking layer is equal to or less than one tenth the thickness of the second light-blocking layer.

11. The detection device according to claim 3, further comprising a filter layer configured to block light in a predetermined wavelength band, a first light-transmitting resin layer, a second light-transmitting resin layer, and lenses wherein the filter layer is provided on the upper side of the second light-transmitting resin layer, and the lenses are provided on the upper side of the filter layer so as to be directly in contact with the filter layer.

12. The detection device according to claim 11, wherein a thickness of the first light-transmitting resin layer is less than a thickness of the second light-transmitting resin layer.

13. The detection device according to claim 11, wherein a width of the first opening is less than a width of the second opening, and the width of the second opening is less than a width of each of the lenses.

14. The detection device according to claim 11, wherein the thickness of the first light-blocking layer is equal to or less than one tenth the thickness of the second light-blocking layer.

* * * * *